United States Patent
You

(10) Patent No.: US 11,392,501 B2
(45) Date of Patent: Jul. 19, 2022

(54) STORAGE DEVICE AND METHOD OF OPERATING THE STORAGE DEVICE

(71) Applicant: SK hynix Inc., Icheon-si (KR)

(72) Inventor: Byoung Sung You, Seoul (KR)

(73) Assignee: SK hynix Inc., Icheon-si (KR)

( * ) Notice: Subject to any disclaimer, the term of this patent is extended or adjusted under 35 U.S.C. 154(b) by 125 days.

(21) Appl. No.: 16/818,933

(22) Filed: Mar. 13, 2020

(65) Prior Publication Data

US 2021/0042234 A1  Feb. 11, 2021

(30) Foreign Application Priority Data

Aug. 9, 2019 (KR) .................. 10-2019-0097805

(51) Int. Cl.
*G06F 12/0882* (2016.01)
*G11C 7/10* (2006.01)
*G06F 12/02* (2006.01)
*G06F 12/0873* (2016.01)

(52) U.S. Cl.
CPC ...... *G06F 12/0882* (2013.01); *G06F 12/0246* (2013.01); *G06F 12/0873* (2013.01); *G11C 7/1045* (2013.01); *G11C 7/1057* (2013.01); *G11C 7/1084* (2013.01); *G06F 2212/7201* (2013.01); *G06F 2212/7209* (2013.01)

(58) Field of Classification Search
None
See application file for complete search history.

(56) References Cited

U.S. PATENT DOCUMENTS

| | | | |
|---|---|---|---|
| 8,046,527 B2 | 10/2011 | Pyeon et al. | |
| 2015/0286438 A1* | 10/2015 | Simionescu | G06F 12/0888 711/103 |
| 2015/0301941 A1* | 10/2015 | Jun | G06F 12/0638 711/103 |
| 2020/0042232 A1* | 2/2020 | Lee | G06F 3/061 |

FOREIGN PATENT DOCUMENTS

KR  1020090102192 A  9/2009

\* cited by examiner

*Primary Examiner* — Stephanie Wu
(74) *Attorney, Agent, or Firm* — William Park & Associates Ltd.

(57) ABSTRACT

Provided herein may be a storage device and a method of operating the same. The storage device may include: a memory device including a memory cell array and a page buffer; and a memory controller including a write buffer. The memory device may further include a page buffer state determiner configured to generate a page buffer state signal based on a state of the page buffer and provide the page buffer state signal to the memory controller. The memory controller may further include a write operation controller configured to provide data provided from a host to either the page buffer or the write buffer in response to the page buffer state signal, and control the memory device to program data stored in the page buffer to the memory cell array based on the state of the write buffer.

26 Claims, 21 Drawing Sheets

STORAGE DEVICE AND METHOD OF OPERATING THE STORAGE DEVICE

CROSS-REFERENCE TO RELATED APPLICATION

The present application claims priority under 35 U.S.C. § 119(a) to Korean patent application number 10-2019-0097805 filed on Aug. 9, 2019, in the Korean Intellectual Property Office, the entire disclosure of which is incorporated herein by reference.

BACKGROUND

1. Technical Field

Various embodiments of the present disclosure generally relate to an electronic device, and more particularly, to a storage device and a method of operating the storage device.

2. Related Art

Generally, a storage device is a device which stores data under control of a host device such as a computer or a smartphone. The storage device may include a memory device configured to store data, and a memory controller configured to control the memory device. Memory devices are chiefly classified into volatile memory devices and nonvolatile memory devices.

A volatile memory device is a memory device, which stores data only when power is supplied thereto, and in which data stored therein is lost when power is turned off. Examples of a volatile memory device include a static random access memory (SRAM), and a dynamic random access memory (DRAM).

A nonvolatile memory device is a memory device in which data stored therein is maintained even when power is turned off. Examples of a nonvolatile memory device include a read-only memory (ROM), a programmable ROM (PROM), an electrically programmable ROM (EPROM), an electrically erasable programmable ROM (EEPROM), and a flash memory.

SUMMARY

An embodiment of the present disclosure may provide for a storage device including: a memory device comprising a memory cell array and a page buffer; and a memory controller comprising a write buffer. The memory device may further include a page buffer state determiner configured to generate a page buffer state signal based on a result of determining a state of the page buffer and provide the page buffer state signal to the memory controller. The memory controller may further include a write operation controller configured to provide data provided from a host to any one of the page buffer and the write buffer in response to the page buffer state signal, and control the memory device to program data stored in the page buffer to the memory cell array based on the state of the write buffer.

An embodiment of the present disclosure may provide for a method of operating a storage device including a memory device including a page buffer, and a memory controller including a write buffer, the method including: storing data provided from a host in any one of the page buffer and the write buffer based on a state of the page buffer; and programming data stored in the page buffer and the write buffer to a memory cell array of the memory device based on a state of the write buffer.

An embodiment of the present disclosure may provide for storage device including: a memory device comprising a memory cell array and a page buffer; and a memory controller comprising a write buffer. The memory device is configured to determine an amount of data stored in the page buffer. The memory controller is configured to provide data to any one of the page buffer and the write buffer based on the amount of data stored in the page buffer, and control the memory device to program the data stored in the page buffer to the memory cell array based on an amount of data stored in the write buffer.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Hereinafter, the present disclosure will be explained by describing embodiments of the present disclosure with reference to the accompanying drawings. Hereinafter, embodiments of the present disclosure will be described with reference to the attached drawings.

Various embodiments of the present disclosure may be directed to a storage device having improved write performance, and a method of operating the storage device.

Figure 1:
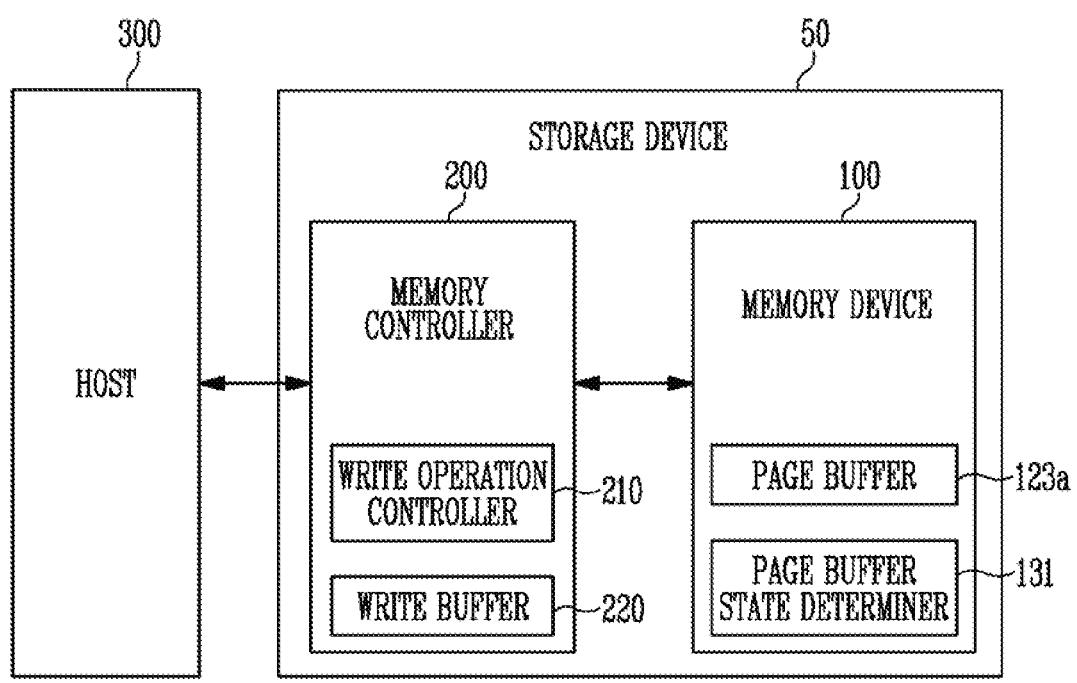
FIG. 1 is a diagram illustrating a storage device in accordance with an embodiment of the present disclosure.

FIG. 1 is a diagram illustrating a storage device 50 in accordance with an embodiment of the present disclosure.

Referring to FIG. 1, the storage device 50 may include a memory device 100 and a memory controller 200 configured to control the operation of the memory device 100. The storage device 50 may be a device configured to store data under control of a host 300 such as a cellular phone, a smartphone, an MP3 player, a laptop computer, a desktop computer, a game machine, a TV, a tablet PC, or an in-vehicle infotainment system.

The storage device 50 may be manufactured as any one of various kinds of storage devices depending on a host interface, which is a communication system for communicating with the host 300. For example, the data storage device 50 may be configured of any one of various kinds of storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may include a memory cell array including a plurality of memory cells configured to store data therein.

The memory cells may include a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. Each memory block may include a plurality of pages. In an embodiment, each page may be the unit of storing data in the memory device 100 or reading stored data from the memory device 100. Each memory block may be the unit of erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, for the sake of explanation, it is assumed that the memory device 100 is a NAND flash memory.

The memory device 100 may receive a command and an address from the memory controller 200 and access an area of the memory cell array that is selected by the address. In other words, the memory device 100 may perform an operation corresponding to the command on the area selected by the address. For example, the memory device 100 may perform a write (program) operation, a read operation, and an erase operation. During a program operation, the memory device 100 may program data to an area selected by an address. During a read operation, the memory device 100 may read data from an area selected by an address. During an erase operation, the memory device 100 may erase data from an area selected by an address.

In an embodiment, the memory device 100 may include a page buffer 123a and a page buffer state determiner 131. The memory device 100 may store, in the page buffer 123a, data received from the memory controller 200 under control of the memory controller 200. For example, when a caching command is received from the memory controller 200, the memory device 100 may store, in the page buffer 123a, data received from the memory controller 200 in response to the caching command.

The page buffer state determiner 131 may determine whether or not the size of data stored in the page buffer 123a is equal to or greater than a predetermined size. The page buffer state determiner 131 may generate a page buffer state signal based on a result of the determination. The word "predetermined" as used herein with respect to a parameter, such as a predetermined size, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm. In an embodiment, the size of data stored in the page buffer 123a may refer to the amount of data stored in the page buffer 123a.

For example, the page buffer state determiner 131 may determine whether or not the amount of data stored in the page buffer 123a is equal to or greater than a predetermined amount of data.

For example, if the size of data stored in the page buffer 123a is equal to or greater than the preset size, the page buffer state determiner 131 may generate an enabled page buffer state signal. If the size of data stored in the page buffer 123a is less than the preset size, the page buffer state determiner 131 may generate a disabled page buffer state signal. The page buffer state determiner 131 may provide a generated page buffer state signal to the memory controller 200.

The memory device 100 may store the received data in the page buffer 123a in a logical page order, in response to the caching command. For example, if each memory cell is a multi-level cell (MLC) capable of storing two data bits, the memory device 100 may store least significant bit (LSB) page data in the page buffer 123a before storing most significant bit (MSB) page data therein. If each memory cell is a triple level cell (TLC) capable of storing three data bits, the memory device 100 may store data in the page buffer 123a in a sequence of LSB page data, central significant bit (CSB) page data, and MSB page data.

The memory device 100 may program the data stored in the page buffer 123a to a memory cell array under control of the memory controller 200. For example, if a program command is received from the memory controller 200, the memory device 100 may program the data stored in the page buffer 123a to the memory cell array, in response to the program command.

The memory device 100 may program the data stored in the page buffer 123a to the memory cell array in a logical page order, in response to the program command. For example, if each memory cell is an MLC, the memory device 100 may program the LSB page data among the data stored in the page buffer 123a to the memory cell array before programming the MSB page data to the memory cell array. If each memory cell is a TLC, the memory device 100 may program the data stored in the page buffer 123a to the memory cell array in a sequence of the LSB page data, the CSB page data, and MSB page data.

The memory device 100 may read data stored in the memory cell array under control of the memory controller 200. For example, the memory device 100 may store data read from the memory cell array in the page buffer 123a after having programmed data stored in the page buffer 123a to the memory cell array. The memory device 100 may provide the data stored in the page buffer 123a to the memory controller 200.

The memory controller 200 may control overall operations of the storage device 50.

When power is applied to the storage device 50, the memory controller 200 may execute firmware (FW). In the case where the memory device 100 is a flash memory device, the memory controller 200 may execute firmware such as a flash translation layer (FTL) for controlling communication between the host 300 and the memory device 100.

In an embodiment, the memory controller 200 may receive data and a logical block address (LBA) from the host 300, and translate the LBA into a physical block address (PBA) indicating addresses of memory cells to which data is to be stored, the memory cells being included in the memory device 100.

The memory controller 200 may control the memory device 100 to perform a program operation, a read operation, or an erase operation in response to a request from the host 300. During the program operation, the memory controller 200 may provide a program command, a PBA, and data to the memory device 100. During the read operation, the memory controller 200 may provide a read command and a PBA to the memory device 100. During the erase operation, the memory controller 200 may provide an erase command and a PBA to the memory device 100.

In an embodiment, the memory controller 200 may autonomously generate a program command, an address and data regardless of a request from the host 300, and transmit them to the memory device 100. For example, the memory controller 200 may provide a command, an address and data to the memory device 100 to perform background operations such as a program operation for wear leveling, and a program operation for garbage collection.

In an embodiment, the memory controller 200 may control at least two or more memory devices 100. In this case, the memory controller 200 may control the memory devices 100 in an interleaving manner to enhance the operating performance. The interleaving scheme may be an operating scheme of overlapping operating periods of at least two or more memory devices 100.

In an embodiment, the memory controller 200 may include a write operation controller 210 and a write buffer 220.

The write operation controller 210 may set a write operation mode based on the state of the page buffer 123a. The write operation controller 210 may determine the state of the page buffer 123a based on a page buffer state signal provided from the page buffer state determiner 131.

For example, the write operation controller 210 may set the write operation mode to either a normal mode or a bypass mode, depending on a result of comparing the size of data stored in the page buffer 123a with a first size. The first size may be the size of data capable of being stored in one physical page. In an embodiment, a first size may refer to a first amount of data. For example, the first amount of data may be the amount of data capable of being stored in one physical page.

If the size of the data stored in the page buffer 123a is less than the first size, the write operation controller 210 may set the write operation mode to the bypass mode. If the size of the data stored in the page buffer 123a is equal to or greater than the first size, the write operation controller 210 may set the write operation mode to the normal mode.

The write operation controller 210 may control the memory device 100 and the write buffer 220 so that data provided from the host 300 is stored in any one of the page buffer 123a and the write buffer 220 depending on the write operation mode.

For example, if the write operation mode is a bypass mode, the write operation controller 210 may control the memory device 100 to store data provided from the host 300 in the page buffer 123a. The data to be stored in the page buffer 123a may be data obtained by performing an ECC encoding operation and a randomizing operation. If the write operation mode is a normal mode, the write operation controller 210 may store data provided from the host 300 in the write buffer 220.

In an embodiment, the write operation controller 210 may control the memory device 100 to program data stored in the page buffer 123a and the write buffer 220 to the memory cell array of the memory device 100 based on the state of the write buffer 220.

For example, if the size of data stored in the write buffer 220 is equal to or greater than a second size, the write operation controller 210 may control the memory device 100 to program the data stored in the page buffer 123a and the write buffer 220 to the memory cell array of the memory device 100. The second size may be set to various values depending on a write buffer management policy. In an embodiment, the size of data stored in the write buffer 220 may refer to the amount of data stored in the write buffer 220. For example, if the amount of data stored in the write buffer 220 is equal to or greater than a second amount of data, the write operation controller 210 may control the memory device 100 to program the data stored in the page buffer 123a and the write buffer 220 to the memory cell array of the memory device 100. The second amount of data may be set to various values depending on a write buffer management policy.

In an embodiment, if a read request for data stored in the memory cell array is received from the host 300, the write operation controller 210 may control the memory device 100 to program data stored in the page buffer 123a to the memory cell array.

For example, the write operation controller 210 may control the memory device 100 so that, before a read operation is performed in response to the read request, data that is previously stored in the page buffer 123a is programmed to the memory cell array. If the data that is previously stored in the page buffer 123a is programmed to the memory cell array, the write operation controller 210 may control the memory device 100 to perform the read operation.

Read data may be stored in the page buffer 123a after the data that has been previously stored in the page buffer 123a has been programmed to the memory cell array. The read data may be data read from the memory cell array during the read operation.

If new data is stored in the same logical address as the logical address in which existing data has been stored, the existing data may be cache hit data. In an embodiment, the write operation controller 210 may control the memory device 100 to overwrite the cache hit data among the data stored in the page buffer 123a with new data. The write operation controller 210 may change map information of the cache hit data to map information of the new data. The map information may include information indicating mapping relationship between a logical address and a physical address in which data is stored.

In an embodiment, the write operation controller 210 may invalidate the map information of the cache hit data among the data stored in the write buffer 220. The write operation controller 210 may store the new data in the write buffer 220. The write operation controller 210 may validate the map information of the new data.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
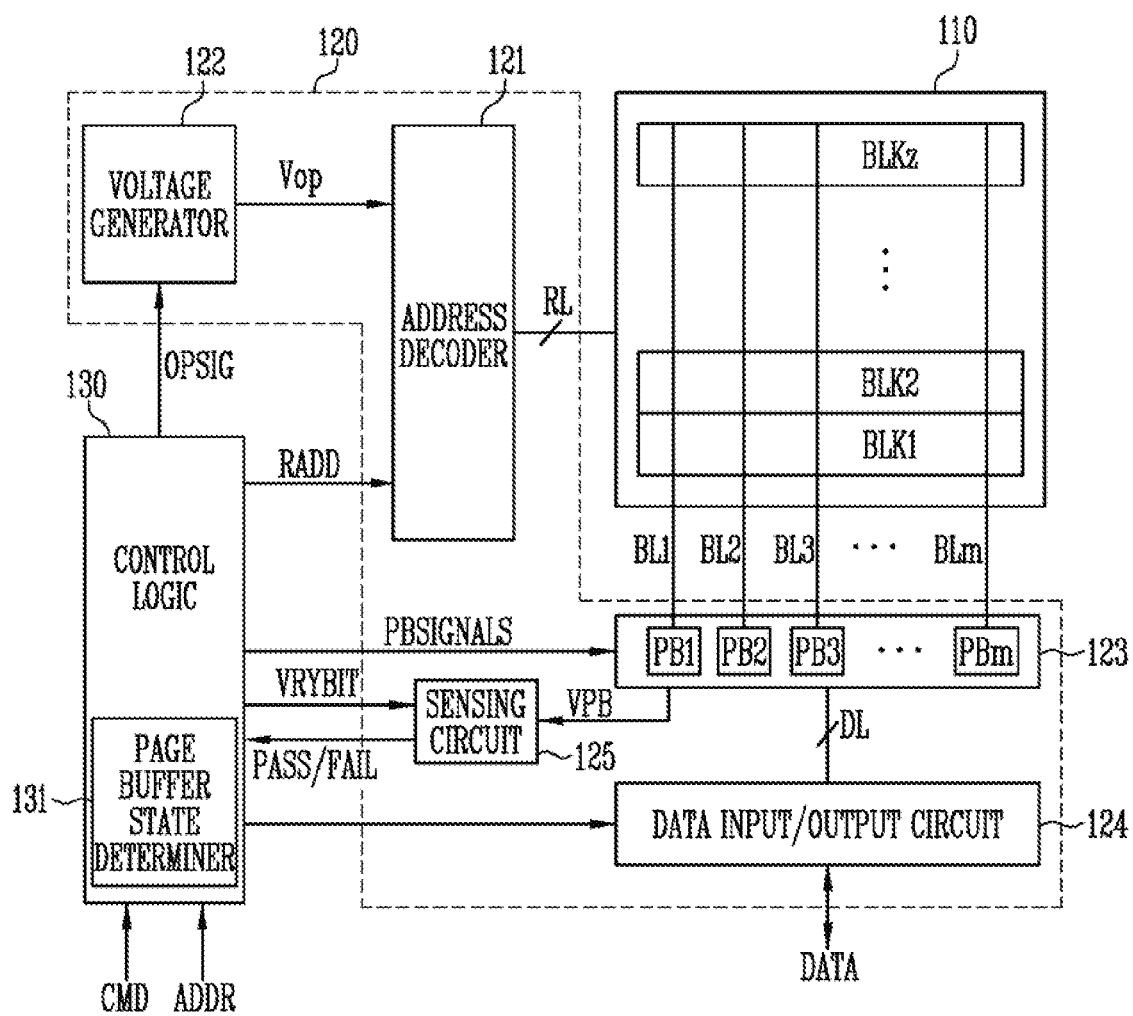
FIG. 2 is a diagram illustrating the configuration of a memory device of FIG. 1.

FIG. 2 is a diagram illustrating the configuration of the memory device 100 of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 may include a plurality of memory blocks BLK1 to BLKz. The plurality of memory blocks BLK1 to BLKz are coupled to the address decoder 121 through the row lines RL. The memory blocks BLK1 to BLKz may be coupled to the read/write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, the memory cell array 110 may be formed of a plurality of pages. In an embodiment, each of the memory blocks BLK1 to BLKz included in the memory cell array 110 may include a plurality of dummy cells. One or more dummy cells may be coupled in series between a drain select transistor and memory cells and between a source select transistor and the memory cells.

Each of the memory cells of the memory device 100 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, a read/write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under control of the control logic 130. The address decoder 121 may receive addresses ADDR from the control logic 130.

The address decoder 121 may decode a block address among the received addresses ADDR. The address decoder 121 may select at least one of the memory blocks BLK1 to BLKz according to the decoded block address. The address decoder 121 may decode a row address RADD among the received addresses ADDR. The address decoder 121 may select at least one word line WL of the selected memory block by applying voltages supplied from the voltage generator 122 to at least one word line WL according to the decoded row address RADD.

During a program operation, the address decoder 121 may apply a program voltage to a selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of the read voltage to unselected word lines.

In an embodiment, an erase operation of the memory device 100 may be performed on a memory block basis. During the erase operation, an address ADDR to be input to the memory device 100 includes a block address. The address decoder 121 may decode the block address and select a corresponding memory block according to the decoded block address. During the erase operation, the address decoder 121 may apply a ground voltage to word lines coupled to the selected memory block.

In an embodiment of the present disclosure, the address decoder 121 may decode a column address among the transmitted addresses ADDR. The decoded column address may be transmitted to the read/write circuit 123. For example, the address decoder 121 may include components such as a row decoder, a column decoder, and an address buffer.

The voltage generator 122 may generate a plurality of operating voltages Vop using an external supply voltage supplied to the memory device 100. The voltage generator 122 may operate under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of operating voltages Vop using an external supply voltage or an internal supply voltage. The voltage generator 122 may generate various voltages required from the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include, so as to generate a plurality of operating voltages Vop having various voltage levels, a plurality of pumping capacitors configured to receive an internal supply voltage, and may generate a plurality of operating voltages Vop by selectively enabling the plurality of pumping capacitors under control of the control logic 130.

The generated operating voltages Vop may be supplied to the memory cell array 110 by the address decoder 121.

The read/write circuit 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may operate under control of the control logic 130.

The first to m-th page buffers PB1 to PBm may communicate data DATA with the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. Memory cells coupled to a bit line to which a program enable voltage (e.g. a ground voltage) is applied may have increased threshold voltages. Threshold voltages of memory cells coupled to a bit line to which a program inhibit voltage (for example, a supply voltage) is applied may be retained. During a program verify operation, the first to m-th page buffers PB1 to PBm may read data DATA from selected memory cells through the bit lines BL1 to BLm.

During a read operation, the read/write circuit 123 may read data DATA from the memory cells of the selected page through the bit lines BL, and store the read data DATA to the first to m-th page buffers PB1 to PBm.

During an erase operation, the read/write circuit 123 may float the bit lines BL. In an embodiment, the read/write circuit 123 may include a column select circuit.

The data input/output circuit 124 is coupled to the first to m-th page buffers PB1 to PBm through the data lines DL. The data input/output circuit 124 may operate under control of the control logic 130.

The data input/output circuit 124 may include a plurality of input/output buffers (not illustrated) for receiving inputted data DATA. During a program operation, the data input/output circuit 124 may receive data DATA to be stored from an external controller (not shown). During a read operation, the data input/output circuit 124 may output, to the external controller, the data DATA received from the first to m-th page buffers PB1 to PBm included in the read/write circuit 123.

During a read operation or a verify operation, the sensing circuit 125 may generate reference current in response to an enable bit signal VRYBIT generated by the control logic 130, compare a sensing voltage VPB received from the read/write circuit 123 with a reference voltage generated by the reference current, and output a pass signal or a fail signal to the control logic 130.

The control logic 130 may be coupled to the address decoder 121, the voltage generator 122, the read/write circuit 123, the data input/output circuit 124, and the sensing circuit 125. The control logic 130 may control the overall operation of the memory device 100. The control logic 130 may operate in response to a command CMD transmitted from an external device.

The control circuit 130 may generate various signals in response to the command CMD and the address ADD and control the peripheral circuit 120. For example, the control logic 130 may generate an operating signal OPSIG, a row address RADD, a read/write circuit control signal PBSIGNALS, and an enable bit VRYBIT in response to the command CMD and the address ADD. The control logic 130 may output the operating signal OPSIG to the voltage generation unit 122, output the row address RADD to the address decoder 121, output the read/write control signal to the read/write circuit 123, and output the enable bit VRYBIT to the sensing circuit 125. Furthermore, the control logic 130 may determine whether target memory cells have passed or failed a verification during the verify operation in response to a pass signal PASS or a fail signal FAIL that is output from the sensing circuit 125.

In an embodiment, the control logic 130 may store data received from the memory controller 200 in the page buffers of the read/write circuit 123 under control of the memory controller 200.

For instance, if a caching command is received from the memory controller 200, the control logic 130 may store data received from the memory controller 200 in the page buffers of the read/write circuit 123 in response to the caching command. The control logic 130 may store the received data in the page buffers of the read/write circuit 123 in a logical page order.

The control logic 130 may program the data stored in the page buffers of the read/write circuit 123 to the memory cell array 110 under control of the memory controller 200.

For example, if a program command is received form the memory controller 200, the control logic 130 may program data stored in the page buffers of the read/write circuit 123 to the memory cell array 110 in response to the program command. The control logic 130 may program the data stored in the page buffers of the read/write circuit 123 to the memory cell array 110 in a logical page order in response to the program command.

The control logic 130 may read data stored in the memory cell array 110 under control of the memory controller 200. For example, the control logic 130 may program data that is stored in the page buffers of the read/write circuit 123 to the memory cell array 110 before storing data read from the memory cell array 110 in the page buffers of the read/write circuit 123. The control logic 130 may provide the data stored in the page buffers of the read/write circuit 123 to the memory controller 200 through the data input/output circuit 124.

In an embodiment, the control logic 130 may include the page buffer state determiner 131

The page buffer state determiner 131 may determine whether or not the size of data stored in the page buffers of the read/write circuit 123 is equal to or greater than a predetermined size. The page buffer state determiner 131 may generate a page buffer state signal based on a result of the determination.

For example, if the size of data stored in the page buffers is equal to or greater than the preset size, the page buffer state determiner 131 may generate an enabled page buffer state signal. If the size of data stored in the page buffers is less than the preset size, the page buffer state determiner 131 may generate a disabled page buffer state signal. The page buffer state determiner 131 may provide a generated page buffer state signal to the memory controller 200.

Figure 3:
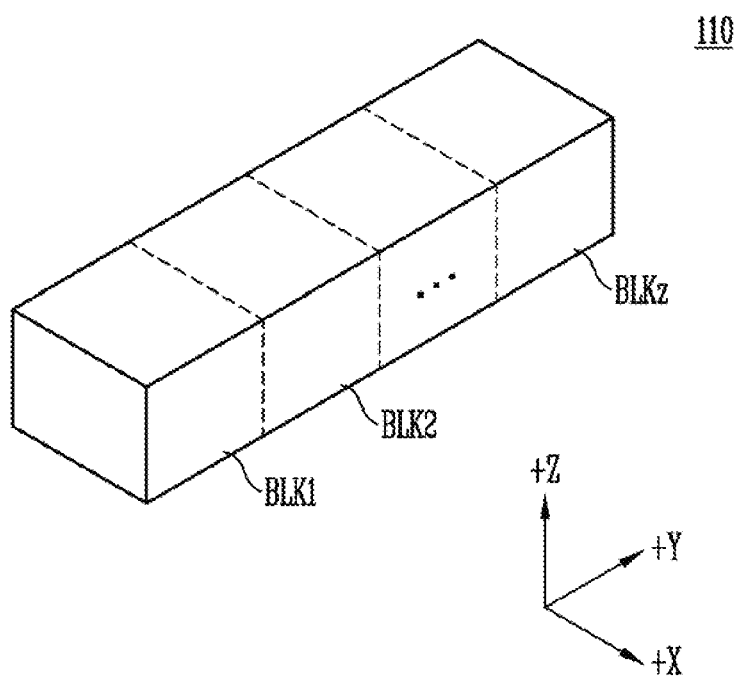
FIG. 3 is a diagram illustrating an embodiment of a memory cell array of FIG. 2.

FIG. 3 is a diagram illustrating an embodiment of the memory cell array 110 of FIG. 2.

Referring to FIG. 3, the memory cell array 110 may include a plurality of memory blocks BLK1 to BLKz. Each memory block has a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 4 and 5.

Figure 4:
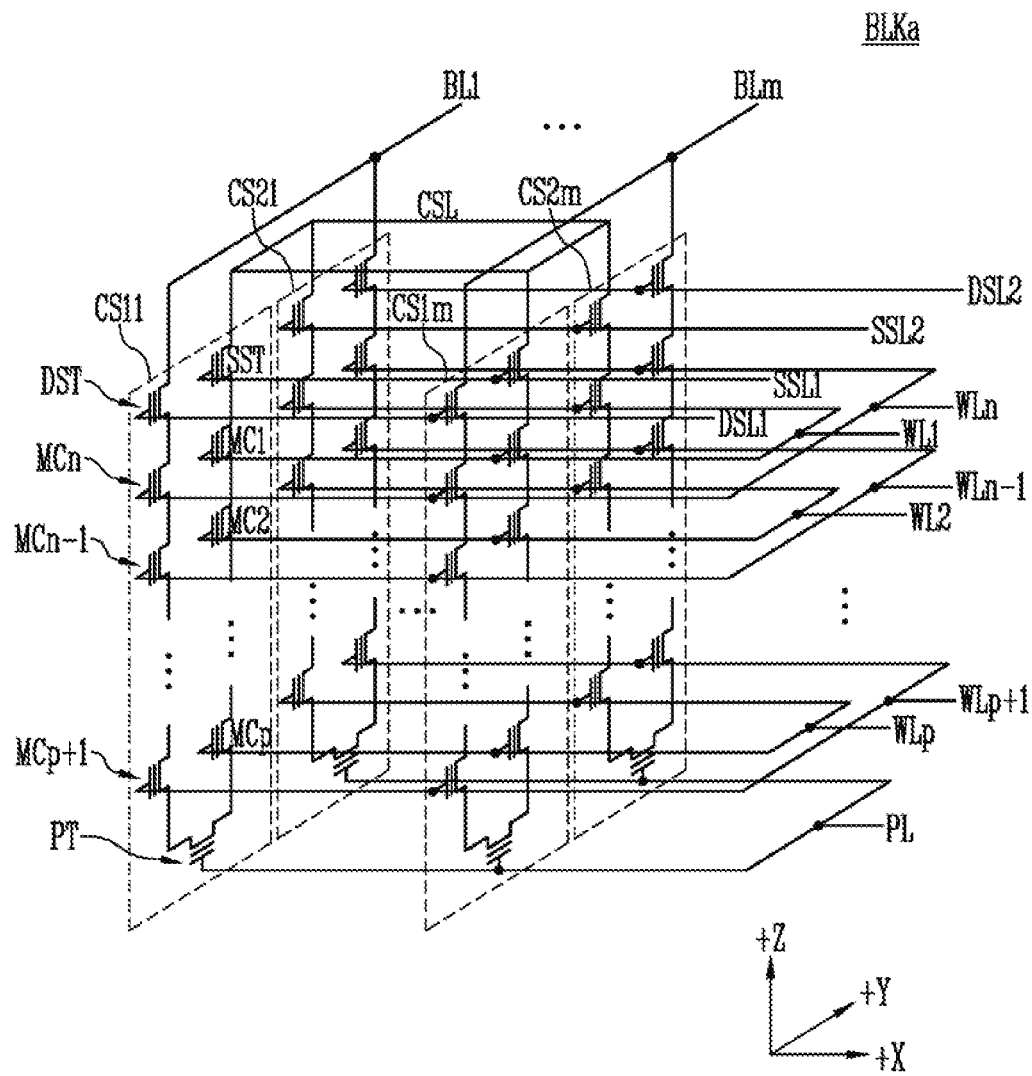
FIG. 4 is a circuit diagram illustrating any one memory block BLKa of memory blocks BLK1 to BLKz of FIG. 3, in accordance with an embodiment of the present disclosure.

FIG. 4 is a circuit diagram illustrating any one memory block BLKa of memory blocks BLK1 to BLKz of FIG. 3, in accordance with an embodiment of the present disclosure.

Figure 5:
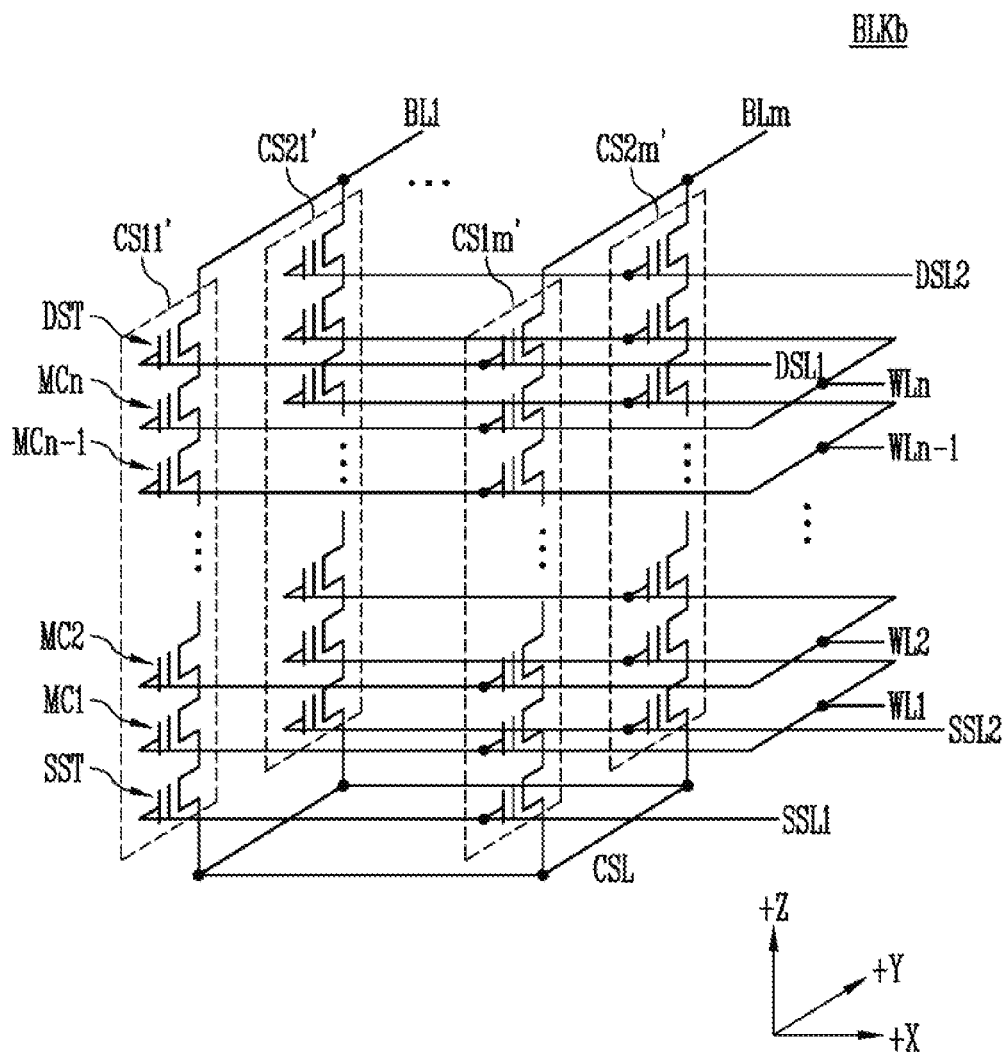
FIG. 5 is a circuit diagram illustrating any one memory block BLKb of the memory blocks BLK1 to BLKz of FIG. 3, in accordance with an embodiment of the present disclosure.

Referring to FIG. 4, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., the +X direction). In FIG. 5, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1m in a first row are coupled to a first source select line SSL1. Source select transistors of the cell strings CS21 to CS2m in a second row are coupled to a second source select line 55L2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to the respective even bit lines. Odd-number-th cell strings of the cell strings CS11 to CS1m or CS21 to CS2m arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one or more dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

FIG. 5 is a circuit diagram illustrating any one memory block BLKb of the memory blocks BLK1 to BLKz of FIG. 3, in accordance with an embodiment of the present disclosure.

Referring to FIG. 5, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLK1'.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequently, the memory block BLKb of FIG. 5 may have an equivalent circuit similar to that of the memory block BLKa of FIG. 4 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one or more dummy memory cells, each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 6:
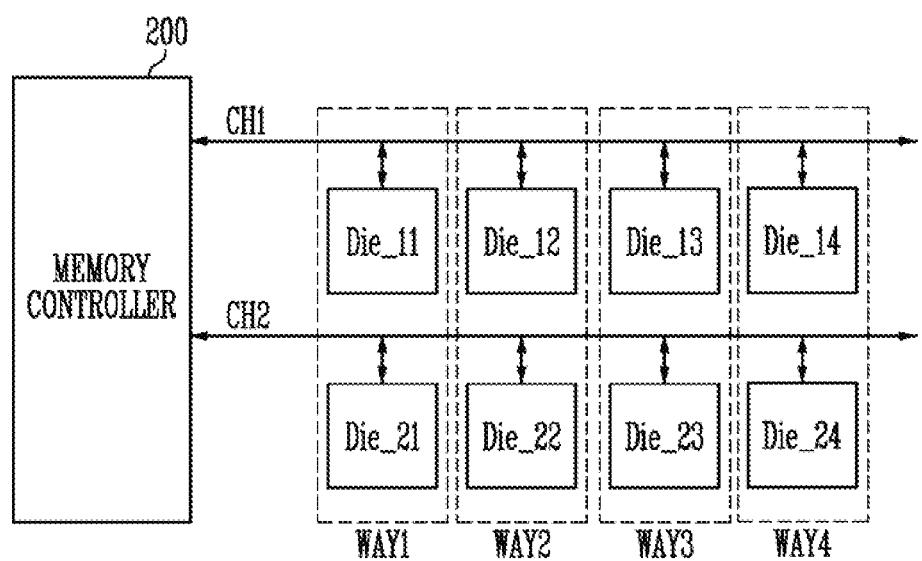
FIG. 6 is a diagram for describing an operation of a memory controller for controlling a plurality of memory devices in accordance with an embodiment of the present disclosure.

FIG. 6 is a diagram for describing an operation of the memory controller 200 for controlling a plurality of memory devices in accordance with an embodiment of the present disclosure.

Referring to FIG. 6, the memory controller 200 may be coupled with a plurality of memory devices (memory device_11 to memory device_24) through a first channel CH1 and a second channel CH2. The number of channels or the number of memory devices coupled to each channel is not limited to that of this embodiment.

A memory device_11 Die_11, a memory device_12 Die_12, a memory device_13 Die_13, and a memory device_14 Die_14 may be coupled in common to the first channel CH1. The memory device_11 Die_11, the memory device_12 Die_12, the memory device_13 Die_13, and the memory device_14 Die_14 may communicate with the memory controller 200 through the first channel CH1.

Since the memory device_11 Die_11, the memory device_12 Die_12, the memory device_13 Die_13, and the memory device_14 Die_14 are coupled in common to the first channel CH1, only one memory device may communicate with the memory controller 200 at a time. However, respective internal operations of the memory device_11

Die_11, the memory device_12 Die_12, the memory device_13 Die_13, and the memory device_14 Die_14 may be performed at the same time.

A memory device_21 Die_21, a memory device_22 Die_22, a memory device_23 Die_23, and a memory device_24 Die_24 may be coupled in common to the second channel CH2. The memory device_21 Die_21, the memory device_22 Die_22, the memory device_23 Die_23, and the memory device_24 Die_24 may communicate with the memory controller 200 through the second channel CH2.

Since the memory device_21 Die_21, the memory device_22 Die_22, the memory device_23 Die_23, and the memory device_24 Die_24 are coupled in common to the second channel CH2, only one memory device may communicate with the memory controller 200 at a time. However, respective internal operations of the memory device_21 Die_21, the memory device_22 Die_22, the memory device_23 Die_23, and the memory device_24 Die_24 may be performed at the same time.

In the storage device using a plurality of memory devices, the performance may be enhanced using a data interleaving operation which is a data communication operation using an interleave scheme. In a structure in which two or more ways share a single channel, the data interleaving operation may be to perform a read or write operation while changing the ways. For the data interleaving operation, the memory devices may be managed on a channel and way basis. To maximize parallelization of the memory devices coupled to each channel, the memory controller 200 may disperse and allocate successive logical memory areas to the channels and the ways.

For example, the memory controller 200 may transmit a command, a control signal including an address, and data to the memory device_11 Die_11 through the first channel CH1. While the memory device_11 Die_11 programs the transmitted data to memory cells included therein, the memory controller 200 may transmit a command, a control signal including an address, and data to the memory device_12 Die_12.

Referring to FIG. 6, the plurality of memory devices may be configured of four ways WA1 to WAY4. The first way WAY1 may include the memory device_11 Die_11 and the memory device_21 Die_21. The second way WAY2 may include the memory device_12 Die_12 and the memory device_22 Die_22. The third way WAY3 may include the memory device_13 Die_13 and the memory device_23 Die_23. The fourth way WAY4 may include the memory device_14 Die_14 and the memory device_24 Die_24.

Each of the channels CH1 to CH2 may be a bus for signals which is shared by the memory devices coupled to the corresponding channel.

Although in FIG. 6 there has been described the case where the data interleaving is applied to a 2-channel/4-way structure, the efficiency of the interleaving may be increased as the number of channels and the number of ways are increased.

Figure 7A:
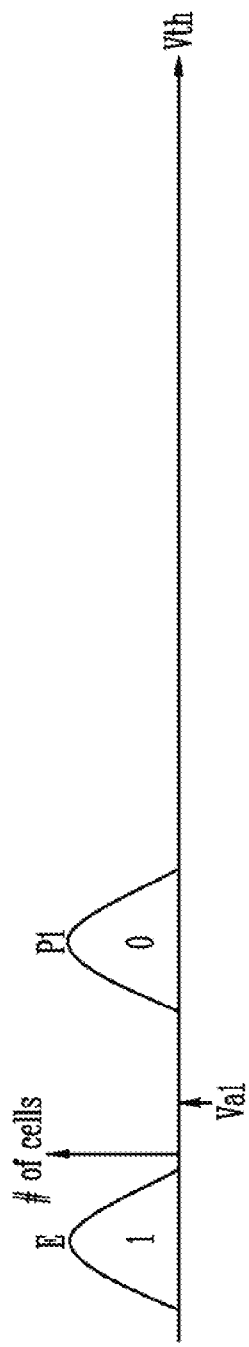
FIGS. 7A, 7B, and 7C are diagrams illustrating threshold voltage distributions of memory cells and logical page data in accordance with an embodiment of the present disclosure.
Figure 7B:
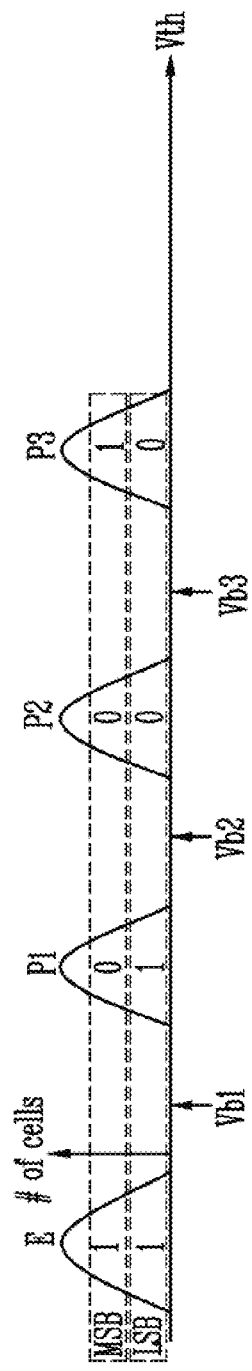
Figure 7C:
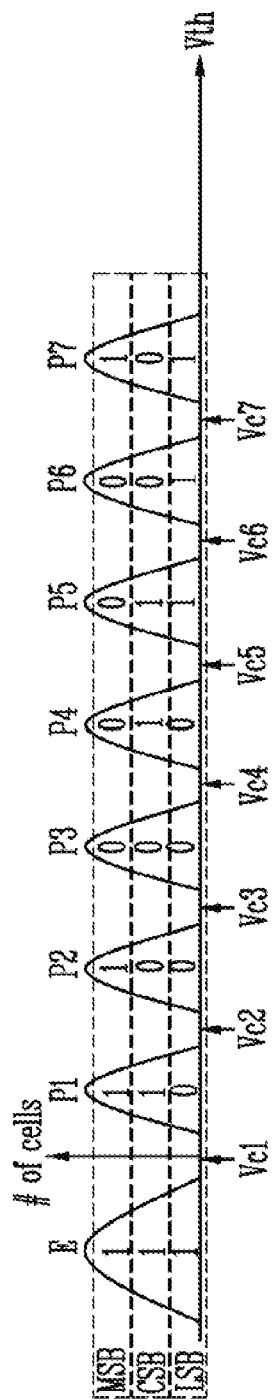

FIGS. 7A, 7B, and 7C are diagrams illustrating threshold voltage distributions of memory cells and logical page data in accordance with an embodiment of the present disclosure.

FIG. 7 FIGS. 7A, 7B, and 7C, the horizontal axis of each graph indicates the level of a threshold voltage, and the vertical axis thereof indicates the number of memory cells.

In graphs 7A to 7C, it is assumed that the number of data bits that may be stored in each memory cell ranges 1 to 3. However, the number of data bits that may be stored in each memory cell is not limited to that of this embodiment of the present disclosure.

Graph 7A illustrates threshold voltage distributions of single-level cells (SLCs) each of which is capable of storing a single data bit. A single-level cell may have any one state of an erased state E or a programmed state P1.

A read voltage Val may be a read voltage for distinguishing the erased state E from the programmed state P1. When a single-level cell having the erased state E is read using the read voltage Val, the single-level cell may be read as an ON cell. The ON cell may correspond to logical value '1'. When a single-level cell having the programmed state P1 is read using the read voltage Val, the single-level cell may be read as an OFF cell. The OFF cell may correspond to logical value '0'.

Graph 7B illustrates threshold voltage distributions of multi-level cells (MLCs) each of which is capable of storing two data bits. The multi-level cell may have any one state of an erased state E and first to third programmed states P1 to P3.

First to third read voltages Vb1 to Vb3 may be read voltages for distinguishing the erased state E and the first to third programmed states P1 to P3 from each other. The first read voltage Vb1 may be a read voltage for distinguishing the erased state E from the first programmed state P1. The second read voltage Vb2 may be a read voltage for distinguishing the first programmed state P1 from the second programmed state P2. The third read voltage Vb3 may be a read voltage for distinguishing the second programmed state P2 from the third programmed state P3.

Depending on a result of reading a multi-level cell using the first to third read voltages Vb1 to Vb3, the multi-level cell may be determined to have any one state of the erased state E and the first to third programmed states P1 to P3.

The erased state E and the first to third programmed states P1 to P3 may respectively correspond to logical data '11', '01', '00', and '10'. The logical data corresponding to each state is not limited to that of this embodiment.

Multi-level cells coupled to each word line may form a single physical page. Logical pages corresponding to a single physical page may include a most significant bit (MSB) page and a least significant bit (LSB) page. The MSB page may be a page which stores the most significant data bit of two data bits which may be stored in each multi-level cell. The LSB page may be a page which stores the least significant data bit of two data bits which may be stored in each multi-level cell.

Graph 7C illustrates threshold voltage distributions of triple-level cells (TLCs) each of which is capable of storing three data bits. The triple-level cell may have any one state of an erased state E and first to seventh programmed states P1 to P7.

First to seventh read voltages Vc1 to Vc7 may be read voltages for distinguishing the erased state E and the first to seventh programmed states P1 to P7 from each other. The first read voltage Vc1 may be a read voltage for distinguishing the erased state E from the first programmed state P1. The second read voltage Vc2 may be a read voltage for distinguishing the first programmed state P1 from the second programmed state P2. Likewise, the seventh read voltage Vc7 may be a read voltage for distinguishing the sixth programmed state P6 from the seventh programmed state P7.

Depending on a result of reading a triple-level cell using the first to seventh read voltages Vc1 to Vc7, the triple-level cell may be determined to have any one state of the erased state E and the first to seventh programmed states P1 to P7.

The erased state E and the first to seventh programmed states P1 to P7 may respectively correspond to logical data '111', '110, '100', '000', '010', '011', '001', and '101'. The logical data corresponding to each state is not limited to that of this embodiment.

Triple-level cells coupled to each word line may form a single physical page. Logical pages corresponding to a single physical page may include an MSB page, a central significant bit (CSB) page, and an LSB page. The MSB page may be a page which stores the most significant data bit of three data bits which may be stored in each triple-level cell. The CSB page may be a page which stores the central significant data bit of three data bits which may be stored in each triple-level cell. The LSB page may be a page which stores the least significant data bit of three data bits which may be stored in each triple-level cell.

Comparing graphs 7A to 7C, as the number of data bits that may be stored in each memory cell is increased, the number of programmed states that may be represented by each memory cell and the number of read voltages for distinguishing the respective programmed states from each other may be increased. As the number of programmed states that may be represented by each memory cell is increased, the width of the threshold voltage distribution corresponding to each programmed state may be reduced.

Figure 8:
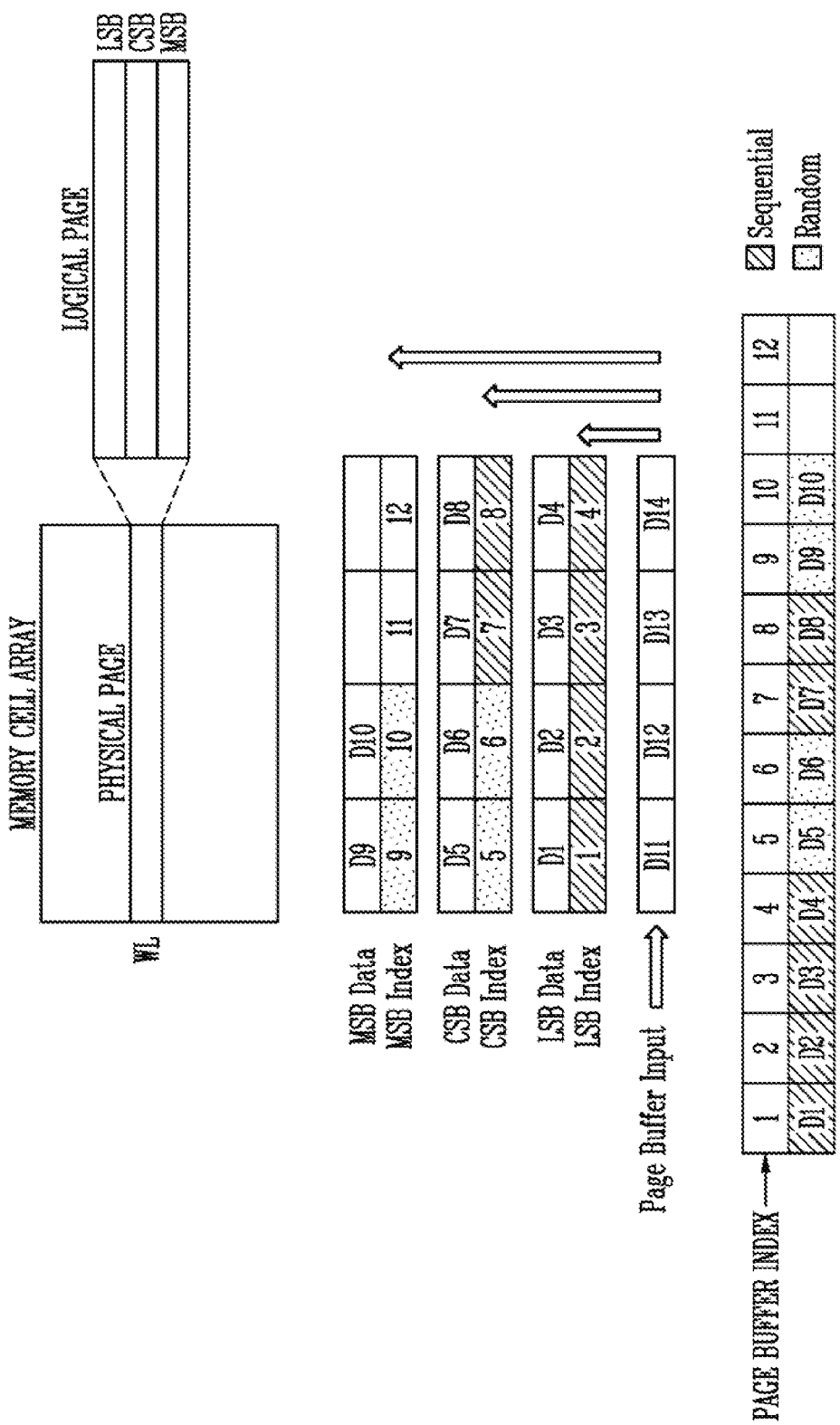
FIG. 8 is a diagram for describing a data program operation in accordance with an embodiment of the present disclosure.

FIG. 8 is a diagram for describing a data program operation in accordance with an embodiment of the present disclosure.

Referring to FIG. 8, the memory cell array may include a physical page. The physical page may be the unit of storing data in memory cells coupled in common to a word line.

The single physical page may correspond to a plurality of logical pages. In the case where a memory cell is a triple level cell (TLC), the memory cell may store three data bits. In this case, logical pages corresponding to a single physical page may include an LSB page, a CSB page, and an MSB page. The number of data bits that are stored in a single memory cell and the number of logical pages that correspond to a single physical page are not limited to those of this embodiment.

A page buffer index may indicate data storage space of page buffers corresponding to a single physical page. The size of storage space corresponding to each index may be set to the same value. For example, the size of the storage space of page buffers corresponding to a single index may be set to 4 kB.

The size of storage space corresponding to all page buffer indexes may correspond to the size of data capable of being stored in a single physical page. The size of data capable of being stored in a single physical page may be the maximum size of data capable of being programmed to the memory cell array during a single program operation. The reason for this is because the program operation is performed on a page basis.

An operation of programming data stored in all page buffers corresponding to a single physical page at a time is referred to as a one-shot program operation. Referring to FIG. 8, during the one-shot program operation, data may be programmed to a single physical page in a sequence of LSB data, CSB data, and MSB data.

In FIG. 8, storage spaces corresponding to page buffer indexes 1 to 4 may be space for storing the LSB data. Storage spaces corresponding to page buffer indexes 5 to 8 may be space for storing the CSB data. Storage spaces corresponding to page buffer indexes 9 to 12 may be space for storing the MSB data.

Storage spaces corresponding to page buffer indexes 1 to 10 may store first to tenth data D1 to D10. The first to fourth data D1 to D4 may be sequential data stored in sequential logical addresses. Likewise, the seventh and eighth data D7 and D8 may also be sequential data.

The fifth and sixth data D5 and D6 may be random data stored in non-sequential logical addresses. In other words, a logical address in which the fifth data D5 is stored and a logical address in which the sixth data D6 is stored are not sequential. Likewise, the ninth and tenth data D9 and D10 may also be random data.

The first to fourth data D1 to D4 may be LSB data that are stored in an LSB page among logical pages corresponding to a single physical page. The fifth to eighth data D5 to D8 may be CSB data that are stored in a CSB page among the logical pages corresponding to the single physical page. The ninth and tenth data D9 and D10 may be MSB data that are stored in an MSB page among the logical pages corresponding to the single physical page.

Eleventh to fourteenth data D11 to D14 may be data that is input to the page buffers. The eleventh and twelfth data D11 and D12 among the data that is input to the page buffers may be stored in storage spaces corresponding to page buffer indexes 11 and 12. The thirteenth and fourteenth data D13 and D14 among the data that is input to the page buffers may be stored in the page buffers after the first to twelfth data D1 to D12 that has been previously stored in the page buffers has been programmed to the memory cell array.

In an embodiment, in the case where data stored in some of the page buffers is programmed to a single physical page, at least two program operations may be performed to program the data to the corresponding physical page. In the case of a one-shot program operation of programming data stored in all of the page buffers to a single physical page, one program operation may be performed. Therefore, after waiting until data is stored in all of the page buffers corresponding to the single physical page, the program operation may be performed at a time. In this case, the number of times program operations have been performed is reduced, so that the efficiency of the entire program operations may be enhanced.

In an embodiment, if an interrupt event such as a read request for data stored in the memory cell array occurs, data may be programmed to the memory cell array even when data has not been stored in all of the page buffers. To perform a read operation in response to a read request, existing data stored in the page buffers may be first programmed to the memory cell array. After the existing data has been programmed to the memory cell array, data read from the memory cell array may be stored in the page buffers. When the read operation is performed, the data stored in the page buffers may be output to an external device in a scheme opposite to that used when data is input from an external device during a program operation.

Figure 9:
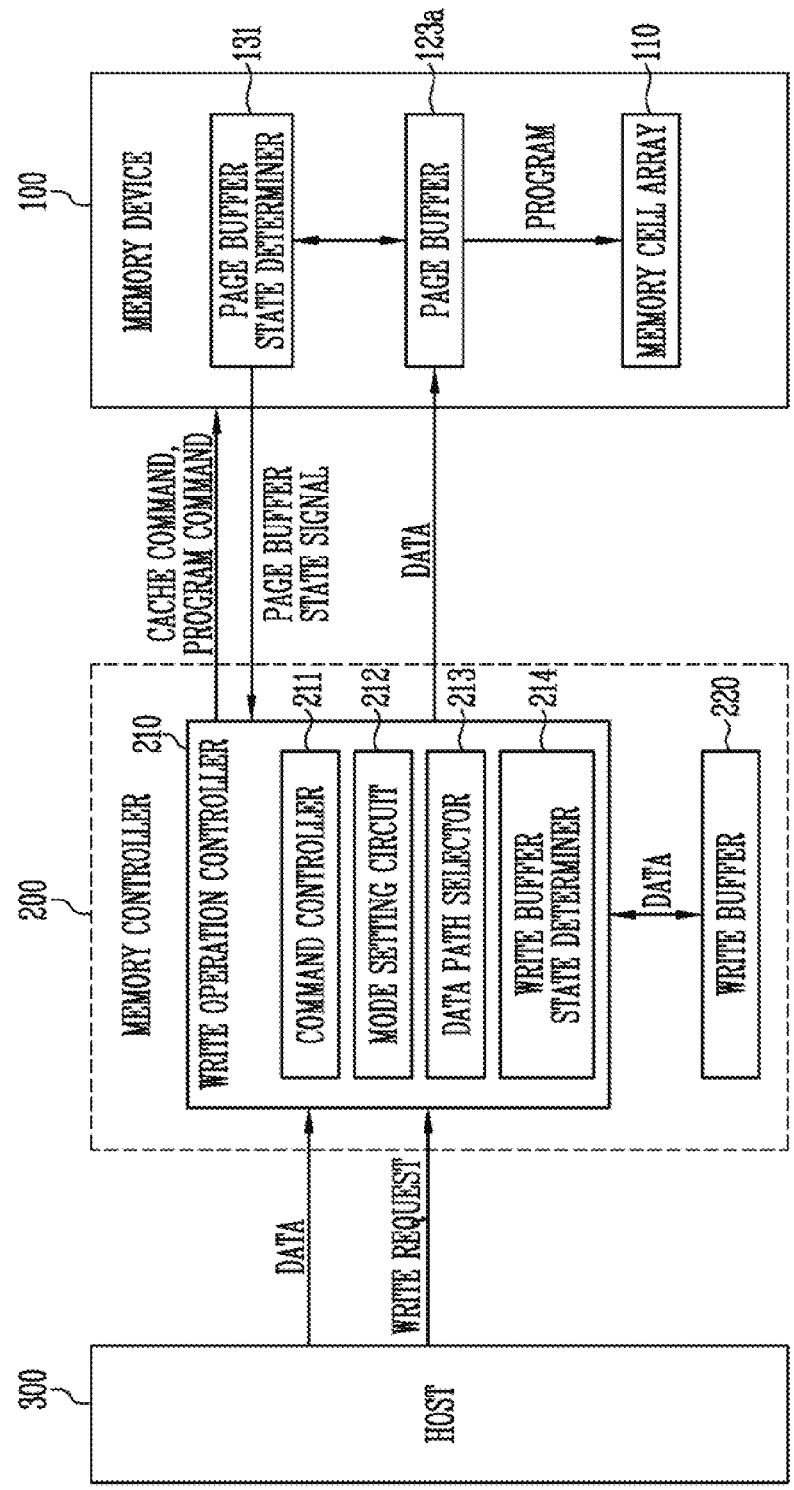
FIG. 9 is a diagram for describing the configuration and operation of the memory controller in accordance with an embodiment of the present disclosure.

FIG. 9 is a diagram for describing the configuration and operation of the memory controller 200 in accordance with an embodiment of the present disclosure.

Referring to FIG. 9, the memory device 100 may include a memory cell array 110, a page buffer 123a, and a page buffer state determiner 131.

The memory device 100 may store data received from the write operation controller 210 in the page buffer 123a, in response to a caching command received from the write operation controller 210. The memory device 100 may store the received data in the page buffer 123a in a logical page order, in response to the caching command.

The memory device 100 may program the data stored in the page buffer 123a to the memory cell array 110 in response to a program command received from the write operation controller 210. The memory device 100 may program the data stored in the page buffer 123a to the memory cell array 110 in a logical page order in response to the program command.

If a read command is received from the memory controller 200, the memory device 100 may program data stored in the page buffer 123a to the memory cell array 110 and thereafter store data read from the memory cell array 110 in the page buffer 123a. The memory device 100 may provide the read data stored in the page buffer 123a to the memory controller 200.

The page buffer state determiner 131 may determine whether or not the size of data stored in the page buffer 123a is equal to or greater than a predetermined size. The page buffer state determiner 131 may generate a page buffer state signal based on a result of the determination.

For example, if the size of data stored in the page buffer 123a is equal to or greater than the preset size, the page buffer state determiner 131 may generate an enabled page buffer state signal. If the size of data stored in the page buffer 123a is less than the preset size, the page buffer state determiner 131 may generate a disabled page buffer state signal. The page buffer state determiner 131 may provide the generated page buffer state signal to the write operation controller 210.

The memory controller 200 may include a write operation controller 210 and a write buffer 220.

The write operation controller 210 may set a write operation mode based on the state of the page buffer 123a. The write operation controller 210 may determine the size of the data stored in the page buffer 123a, based on a page buffer state signal provided from the page buffer state determiner 131. For example, if the page buffer state signal is disabled, the size of the data stored in the page buffer 123a may be less than the preset size. If the page buffer state signal is enabled, the size of the data stored in the page buffer 123a may be equal to or greater than the preset size.

For example, the write operation controller 210 may set the write operation mode to either the normal mode or the bypass mode, depending on a result of comparing the size of data stored in the page buffer 123a with the first size. For example, the first size may be the size of data capable of being stored in a single physical page.

If the size of the data stored in the page buffer 123a is less than the first size, the write operation controller 210 may set the write operation mode to the bypass mode. If the size of the data stored in the page buffer 123a is equal to or greater than the first size, the write operation controller 210 may set the write operation mode to the normal mode.

The write operation controller 210 may control the memory device 100 and the write buffer 220 so that data provided from the host 300 is stored in any one of the page buffer 123a and the write buffer 220 depending on the write operation mode.

For example, if the write operation mode is the bypass mode, the write operation controller 210 may provide a caching command and the data provided from the host 300 to the memory device 100. The caching command may be a command for instructing to store, in the page buffer 123a, the data transmitted to the memory device 100. In an embodiment, the data to be stored in the page buffer 123a may be data obtained by performing an ECC encoding operation and a randomizing operation on the data provided from the host 300.

If the write operation mode is the normal mode, the write operation controller 210 may store the data provided from the host 300 in the write buffer 220.

In an embodiment, the write operation controller 210 may control the memory device 100 to program data stored in the page buffer 123a and the write buffer 220 to the memory cell array 110 of the memory device 100, based on the state of the write buffer 220.

For example, if the size of data stored in the write buffer 220 is equal to or greater than the second size, the write operation controller 210 may control the memory device 100 to program the data stored in the page buffer 123a and the write buffer 220 to the memory cell array 110 of the memory device 100. The second size may be set to various values depending on a write buffer management policy.

For example, the write operation controller 210 may first provide, to the memory device 100, a program command for programming the data stored in the page buffer 123a to the memory cell array 110.

If an operation corresponding to the program command has been completed, the write operation controller 210 may provide, to the memory device 100, a caching command for storing, in the page buffer 123a, the data stored in the write buffer 220. The data stored in the write buffer 220 may be transmitted to the page buffer 123a via a data path selector 213.

If an operation corresponding to the caching command has been completed, the write operation controller 210 may provide, to the memory device 100, a program command for programming the data stored in the page buffer 123a to the memory cell array 110. In this way, the data stored in the write buffer 220 may be programmed to the memory cell array 110 via the page buffer 123a.

In an embodiment, during a read operation in response to a read request, data read from the memory cell array 110 may be stored in the page buffer 123a and then provided to the memory controller 200. To provide the data read from the memory cell array 110 to the memory controller 200 in response to the read request, there is a need to first program existing data that is stored in the page buffer 123a to the memory cell array 110.

Hence, if the read request for the data stored in the memory cell array 110 is received from the host 300, the write operation controller 210 may control the memory device 100 to program the data stored in the page buffer 123a to the memory cell array 100.

In other words, even if the size of the data stored in the write buffer 220 is less than the second size, when a read request is received, the write operation controller 210 may provide, to the memory device 100, a program command for programming the existing data stored in the page buffer 123a to the memory cell array 110.

In various embodiments, if a read request received from the host 300 is a read request for the data stored in the page buffer 123a rather than being a request for the data stored in the memory cell array 110, the write operation controller 210 might not provide a program command to the memory device 100. In this case, since there is no need to program the data stored in the page buffer 123a to the memory cell array 110 to perform the read request, the data stored in the page buffer 123a may be directly provided to the memory controller 200.

In an embodiment, the write operation controller 210 may control the memory device 100 to overwrite cache hit data among the data stored in the page buffer 123a with new data. If new data is stored in the same logical address as the logical address in which existing data has been stored, the existing data may be cache hit data.

The write operation controller 210 may change map information of the cache hit data to map information of the new data. The map information may include information indicating mapping relationship between a logical address and a physical address in which data is stored.

In an embodiment, the write operation controller 210 may invalidate the map information of the cache hit data among the data stored in the write buffer 220. The write operation controller 210 may store the new data in the write buffer 220. The write operation controller 210 may validate the map information of the new data.

In an embodiment, the write operation controller 210 may include a command controller 211, a mode setting circuit 212, a data path selector 213, and a write buffer state determiner 214.

The command controller 211 may provide a caching command and a program command to the memory device 100 in response to a write request input from the host 300.

The mode setting circuit 212 may set the write operation mode to any one of the normal mode and the bypass mode, based on the page buffer state signal. If the write operation mode is the normal mode, data input from the host 300 may be stored in the page buffer 123a. If the write operation mode is the bypass mode, data input from the host 300 may be stored in the write buffer 220.

The data path selector 213 may control an input/output path for data.

In an embodiment, the data path selector 213 may selectively provide the data provided from the host 300 to any one of the write buffer 220 and the page buffer 123a depending on the write operation mode. In an embodiment, the data path selector 213 may selectively provide any one of the data provided from the host 300 and the data provided from the write buffer 220 to the page buffer 123a depending on a write buffer state signal.

The write buffer state determiner 214 may generate the write buffer state signal based on the state of the write buffer 220.

Figure 10A:
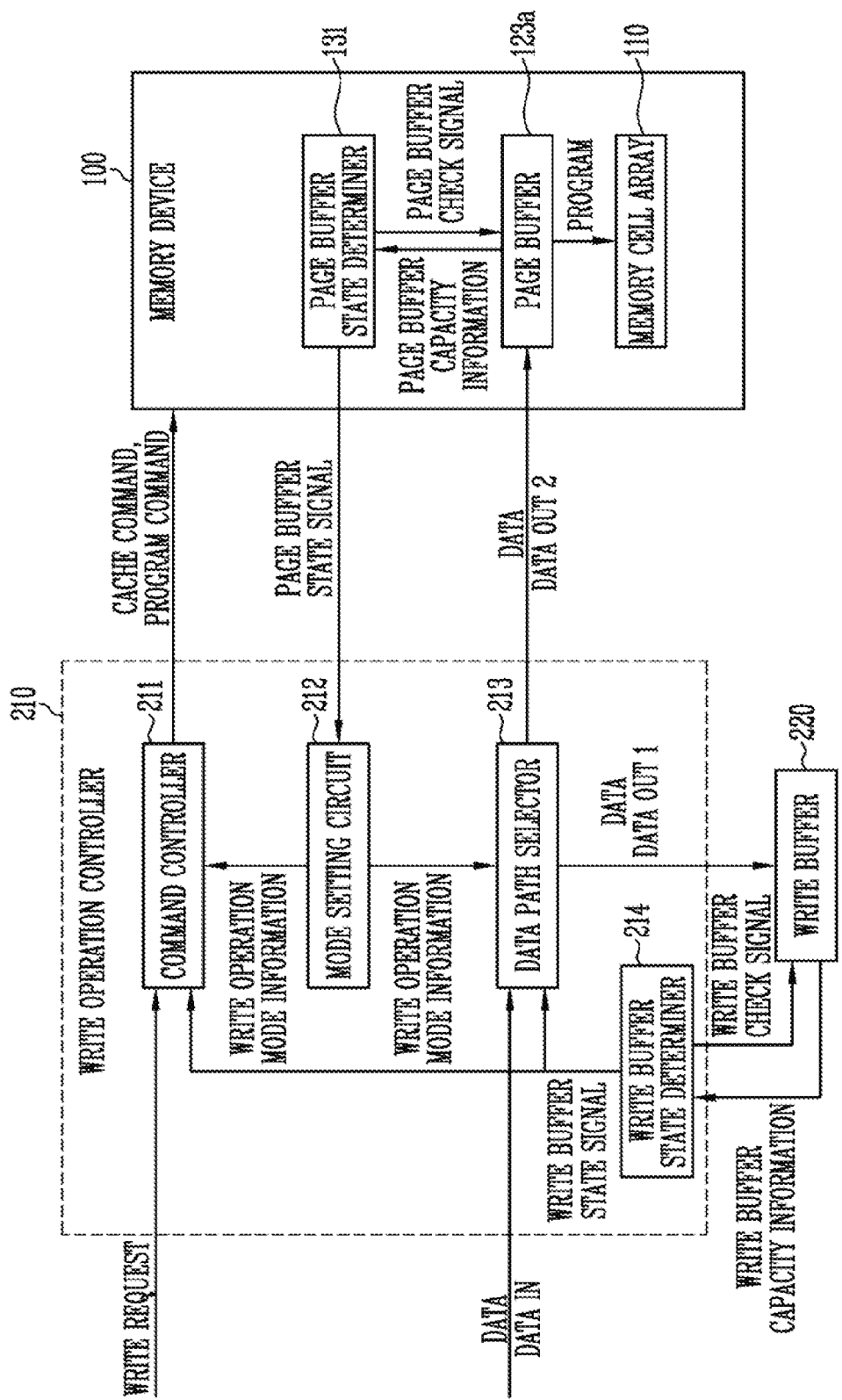
FIG. 10A is a diagram for describing a data input/output path in accordance with an embodiment of the present disclosure.

FIG. 10A is a diagram for describing a data input/output path in accordance with an embodiment of the present disclosure.

Referring to FIG. 10A, the memory device 100 may include a memory cell array 110, a page buffer 123a, and a page buffer state determiner 131.

Data stored in the page buffer 123a may be programmed to the memory cell array 110.

The page buffer state determiner 131 may generate a page buffer state signal based on the state of the page buffer 123a. The page buffer state determiner 131 may determine whether or not the size of data stored in the page buffer 123a is equal to or greater than a preset size.

For example, the page buffer state determiner 131 may provide, to the page buffer 123a, a page buffer check signal for checking the size of the data stored in the page buffer. The page buffer 123a may provide, to the page buffer state determiner 131, page buffer capacity information indicating the capacity of the data stored in the page buffer 123a in response to the page buffer check signal.

The page buffer state determiner 131 may generate a page buffer state signal based on the page buffer capacity information.

For example, if the size of the data stored in the page buffer 123a is equal to or greater than a preset first size, the page buffer state determiner 131 may generate an enabled page buffer state signal. If the size of data stored in the page buffer 123a is less than the preset size, the page buffer state determiner 131 may generate a disabled page buffer state signal. The preset first size may be the size of data capable of being stored in a single physical page.

The page buffer state determiner 131 may provide a generated page buffer state signal to the mode setting circuit 212.

In an embodiment, the write operation controller 210 may include a command controller 211, a mode setting circuit 212, a data path selector 213, and a write buffer state determiner 214.

The command controller 211 may provide a caching command and a program command to the memory device 100 in response to a write request input from the host 300. The caching command may be a command for instructing to store, in the page buffer 123a, the data transmitted to the memory device 100. The program command may be a command for instructing to program the data stored in the page buffer 123a to the memory cell array 110.

The command controller 211 may provide a caching command and a program command to the memory device 100 based on a write operation mode and a write buffer state signal.

For example, the command controller 211 may determine whether the write operation mode is the normal mode or the bypass mode, based on write operation mode setting information provided from the mode setting circuit 212. If the write operation mode is the bypass mode, the command controller 211 may provide a caching command to the memory device 100. If the write operation mode is the normal mode and the write buffer state signal is enabled, the command controller 211 may provide the program command to the memory device 100.

The mode setting circuit 212 may set the write operation mode to any one of the normal mode and the bypass mode, based on the page buffer state signal. If the page buffer state signal is enabled, the mode setting circuit 212 may set the write operation mode to the normal mode. If the page buffer state signal is disabled, the mode setting circuit 212 may set the write operation mode to the bypass mode.

The mode setting circuit 212 may generate write operation mode information indicating whether the write operation mode is the normal mode or the bypass mode. The mode setting circuit 212 may provide the generated write operation mode information to the command controller 211 and the data path selector 213.

The data path selector 213 may control an input/output path for data.

In an embodiment, the data path selector 213 may determine whether the write operation mode is the normal mode or the bypass mode, based on write operation mode setting information provided from the mode setting circuit 212. The data path selector 213 may selectively provide the data provided from the host 300 to any one of the write buffer 220 and the page buffer 123a depending on the write operation mode.

For example, if the write operation mode is the normal mode, the data path selector 213 may provide the data input from the host to the page buffer 123a. If the write operation mode is the bypass mode, the data path selector 213 may provide the data input from the host to the write buffer 220.

The write buffer state determiner 214 may generate a write buffer state signal based on the state of the write buffer 220. The write buffer state determiner 214 may determine whether or not the size of data stored in the write buffer 220 is equal to or greater than a preset size.

For example, the write buffer state determiner 214 may provide, to the write buffer 220, a write buffer check signal for checking the size of the data stored in the write buffer 220. The write buffer 220 may provide, to the write buffer state determiner 214, write buffer capacity information indicating the capacity of the data stored in the write buffer 220 in response to the write buffer check signal.

The write buffer state determiner 214 may generate a write buffer state signal based on the write buffer capacity information.

For example, if the size of data stored in the write buffer 220 is equal to or greater than the preset size, the write buffer state determiner 214 may generate an enabled write buffer state signal. If the size of data stored in the write buffer 220 is less than the preset size, the write buffer state determiner 214 may generate a disabled write buffer state signal.

The write buffer state determiner 214 may provide the generated write buffer state signal to the command controller 211 and the data path selector 213.

Figure 10B:
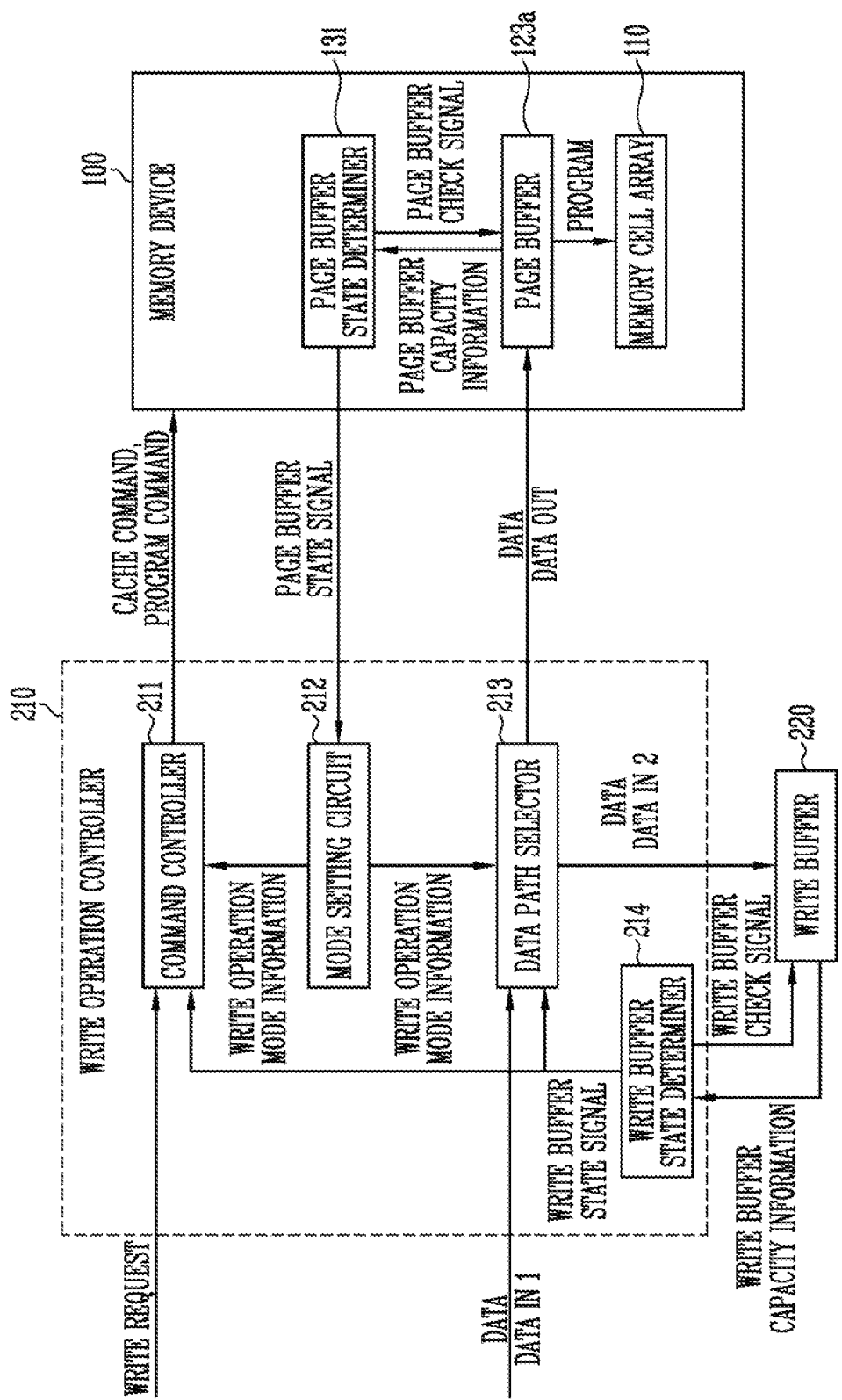
FIG. 10B is a diagram for describing a data input/output path in accordance with an embodiment of the present disclosure.

FIG. 10B is a diagram for describing a data input/output path in accordance with an embodiment of the present disclosure.

Referring to FIGS. 10A and 10B, the data path selector 213 may selectively provide any one of data provided from the host 300 and data provided from the write buffer 220 to the page buffer 123a depending on a write buffer state signal.

For example, if the write buffer state signal is enabled, the data path selector 213 may provide the data provided from the write buffer 220 to the page buffer 123a. If the write buffer state signal is disabled, the data path selector 213 may provide the data provided from the host 300 to the page buffer 123a.

Figure 11A:
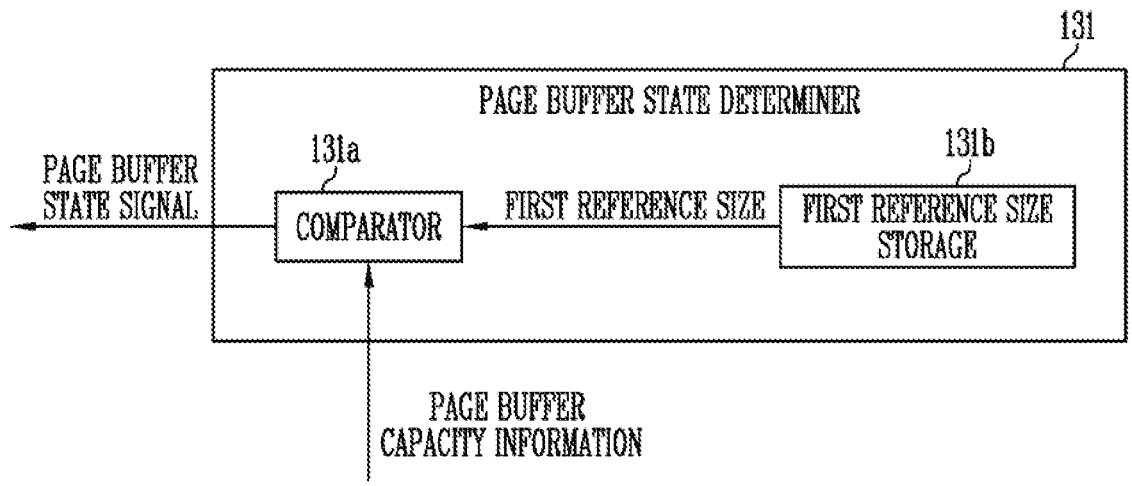
FIG. 11A is a diagram for describing a page buffer state determiner of FIG. 10A.

FIG. 11A is a diagram for describing the page buffer state determiner 131 of FIG. 10A.

Referring to FIG. 11A, the page buffer state determiner 131 may include a comparator 131a and a first reference size storage 131b.

The comparator 131a may receive the page buffer capacity information from the page buffer of FIG. 10A. The comparator 131a may compare the size of the data stored in the page buffer that is included in the page buffer capacity information with a first reference size. The comparator 131a may output a page buffer state signal that is enabled or disabled depending on a result of the comparison.

If the size of the data stored in the page buffer is equal to or greater than the first reference size, the comparator 131a may output an enabled page buffer state signal. If the size of the data stored in the page buffer is less than the first reference size, the comparator 131a may output a disabled page buffer state signal. The first reference size may be the size of data capable of being stored in a single physical page.

Figure 11B:
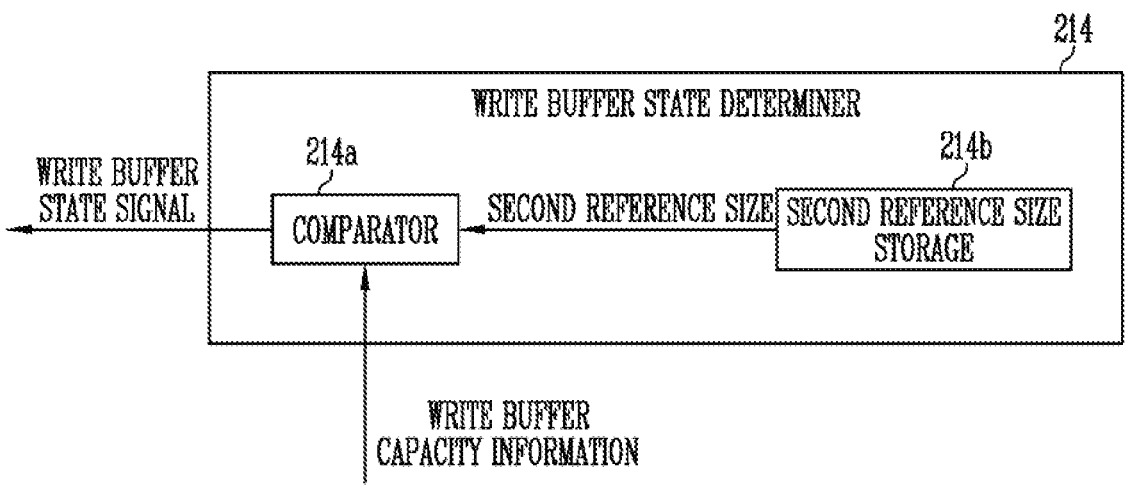
FIG. 11B is a diagram for describing a write buffer state determiner of FIG. 10A.

FIG. 11B is a diagram for describing the write buffer state determiner 214 of FIG. 10A.

Referring to FIG. 11B, the write buffer state determiner 214 may include a comparator 214a and a second reference size storage 214b.

The comparator 214a may receive the write buffer capacity information from the write buffer of FIG. 10A. The comparator 214a may compare the size of the data stored in the write buffer that is included in the write buffer capacity information with a second reference size. The comparator 214a may output a write buffer state signal that is enabled or disabled depending on a result of the comparison.

If the size of the data stored in the write buffer is equal to or greater than the second reference size, the comparator 214a may output an enabled write buffer state signal. If the size of the data stored in the write buffer is less than the second reference size, the comparator 214a may output a disabled write buffer state signal. The second size may be set to various values depending on a write buffer memory management policy.

In an embodiment, the second reference size may be the same as the first reference size of FIG. 11A. In an embodiment, the second reference size may differ from the first reference size of FIG. 11A.

Figure 12:
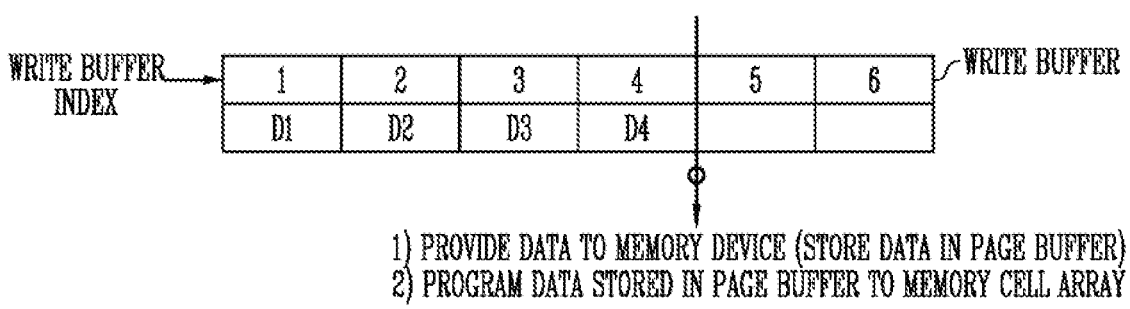
FIG. 12 is a diagram for describing a flush operation in accordance with an embodiment of the present disclosure.

FIG. 12 is a diagram for describing a flush operation in accordance with an embodiment of the present disclosure.

Referring to FIG. 12, the flush operation may be an operation of programming data to the memory cell array. The flush operation may be classified into two operations. A first operation may be a cache operation of storing data in the page buffer. A second operation may be a program operation of programming the data stored in the page buffer to the memory cell array.

A write buffer index may indicate storage space of the write buffer. The size of storage space corresponding to each write buffer index is the same. Referring to FIG. 12, the write buffer may include storage space corresponding to write buffer indexes 1 to 6. The number of write buffer indexes is not limited to this embodiment.

In an embodiment, if data is stored in the storage space corresponding to write buffer indexes 1 to 4, a flush operation may be performed. Here, the size of the storage space corresponding to write buffer indexes 1 to 4 may be a preset size to trigger the flush operation. In other words, if the size of data stored in the write buffer is equal to or greater than the preset size, the flush operation may be performed.

After a cache operation of storing, in the page buffer, first to fourth data D1 to D4 stored in the write buffer is performed, a program operation of programming the data to the memory cell array may be performed.

Figure 13A:
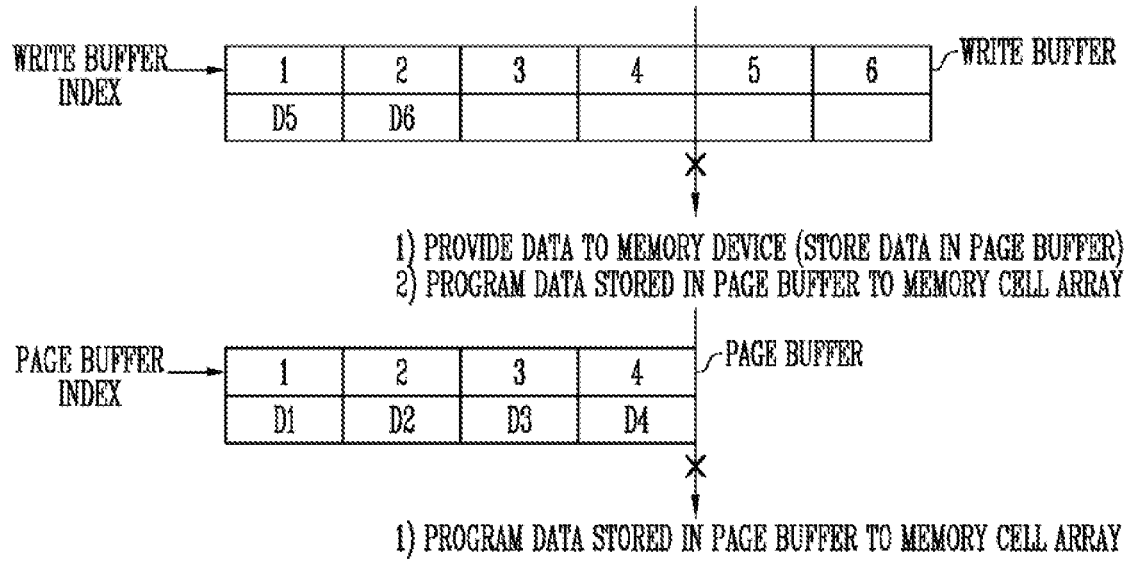
FIG. 13A is a diagram for describing a flush operation in accordance with an embodiment of the present disclosure.

FIG. 13A is a diagram for describing a flush operation in accordance with an embodiment of the present disclosure.

Referring to FIG. 13A, compared to FIG. 12, conditions of triggering the flush operation may include taking into account not only the size of data stored in the write buffer but also the size of data stored in the page buffer. Therefore, if the size of data stored in the page buffer is equal to or greater than the first size and the size of data stored in the write buffer is equal to or greater than the second size, the flush operation may be performed.

The first size may be set to various values depending on a cache management policy of the page buffer. In an embodiment, the first size may be a size capable of performing a one-shot program operation. In other words, the first size may be the size of data capable of being stored in a single physical page. The first size may be set to the same value for each memory device.

The second size may be set to various values depending on a write buffer management policy. For example, in the case of a single die package (SDP) in which the memory controller is coupled with a single memory device through a single channel, the second size may be set to the same as the first size. In the case of a double die package (DDP) in which the memory controller is coupled with two memory devices through a single channel, the second size may be set to a value different from the first size. For example, the second size of the write buffer may be set to double the first size. In various embodiments, the second size may be set to the same as the first size.

The flush operation may be an operation of programming the data stored in the page buffer and the data stored in the write buffer together to the memory cell array. However, since the data stored in the page buffer may be directly programmed to the memory cell array, a flush operation for the data stored in the page buffer may be formed of one program operation of programming data to the memory cell array unlike a flush operation for the data stored in the write buffer.

FIG. 13A will be described, assuming the SDP. The size of storage space corresponding to a write buffer index may be the same as that of storage space corresponding to a page buffer index. The first size may be the size of storage space corresponding to page buffer indexes 1 to 4. The second size may be the same as the first size.

The size of data D1 to D4 stored in the page buffer is the same as the first size, but the size of data D5 and D6 stored in the write buffer is less than the second size. Hence, a flush operation might not be performed.

Figure 13B:
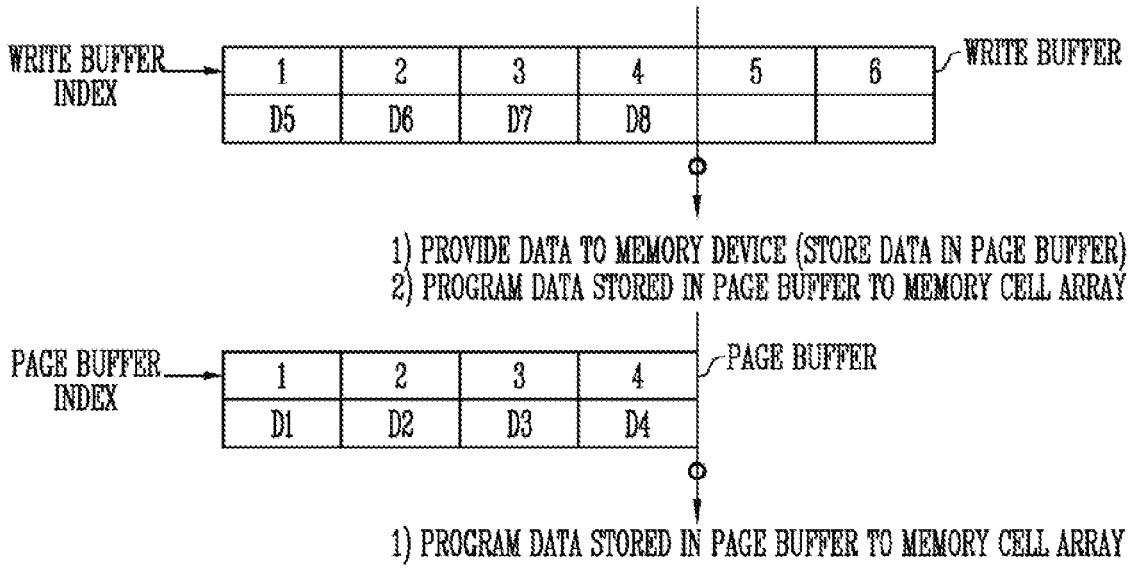
FIG. 13B is a diagram for describing a flush operation in accordance with an embodiment of the present disclosure.

FIG. 13B is a diagram for describing a flush operation in accordance with an embodiment of the present disclosure.

Referring to FIG. 13B, compared to FIG. 13A, seventh and eighth data D7 and D8 are additionally stored in the write buffer. In this case, since the flush operation triggering conditions described with reference to FIG. 13A is satisfied, the flush operation may be performed.

First, a program operation of programming the first to fourth data D1 to D4 stored in the page buffer to the memory cell array may be performed. Thereafter, a cache operation of storing, in the page buffer, the fifth to eighth data D5 to D8 stored in the write buffer may be performed. Lastly, a program operation of programming the fifth to eighth data D5 to D8 stored in the page buffer to the memory cell array may be performed.

In an embodiment of FIG. 12, the size of data capable of being stored until the flush operation is triggered may be the size of storage space corresponding to four buffer indexes. In embodiments of FIGS. 13A and 13B, the size of data capable of being stored until the flush operation is triggered may be the size of storage space corresponding to eight indexes.

Therefore, it may be understood that, compared to the embodiment of FIG. 12, in the embodiments of FIGS. 13A and 13B, the size of data capable of being stored until the flush operation is triggered increases double. As such, since the page buffer is used as an extended area of the write buffer, the limited capacity of the conventional write buffer may be improved. Since the limited capacity of the write buffer is improved, the number of times flush operations are performed may be reduced compared to that of the conventional art. Consequently, the overall program operation performance of the memory device may be enhanced.

Furthermore, as the number of memory devices coupled to each channel is increased, the number of page buffers capable of being used as the extended area of the write buffer is increased. Therefore, the degree to which the capacity of the write buffer is improved may be further increased.

Figure 14A:
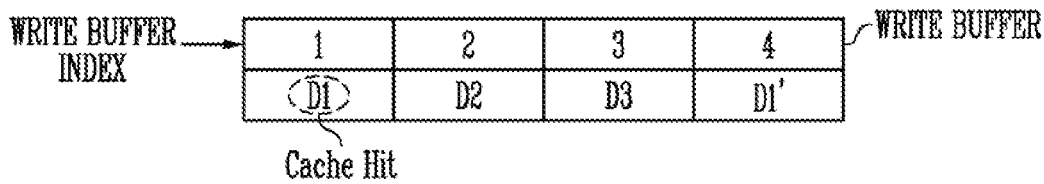
FIG. 14A is a diagram for describing a data write operation of a write buffer of FIG. 9.

FIG. 14A is a diagram for describing a data write operation of the write buffer of FIG. 9.

Referring to FIG. 14A, first to third data D1 to D3 may be stored in storage space corresponding to write buffer indexes 1 to 3.

If new data is stored in the same logical address as the logical address in which existing data has been stored, the existing data may be cache hit data. New data D1' may be stored in the same logical address as the logical address in which the first data D1 has been stored.

Hence, the first data D1 may be cache hit data.

In the case of the write buffer, since an overwrite operation for the cache hit data might not be performed, the new data is additionally stored in the write buffer, and the map information of the cache hit data is invalidated while the map information of the new data is validated.

For example, the map information of the first data D1 that is cache hit data may be invalidated. The new data D1' may be additionally stored in storage space corresponding to write buffer index 4. The map information of the new data D1' may be validated. The map information may include information indicating mapping relationship between a logical address and a physical address in which data is stored.

Figure 14B:
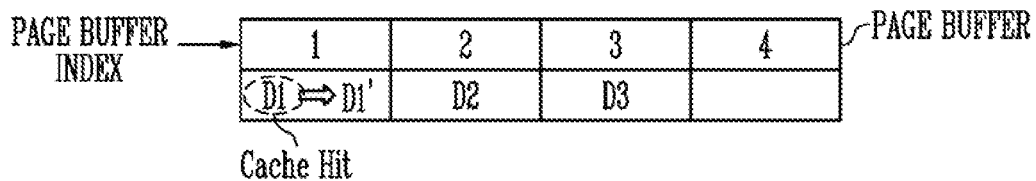
FIG. 14B is a diagram for describing a data write operation of a page buffer of FIG. 9.

FIG. 14B is a diagram for describing a data write operation of the page buffer of FIG. 9.

Referring to FIG. 14B, first to third data D1 to D3 may be stored in storage space corresponding to page buffer indexes 1 to 3.

If new data is stored in the same logical address as the logical address in which existing data has been stored, the existing data may be cache hit data. New data D1' may be stored in the same logical address as the logical address in which the first data D1 has been stored. Hence, the first data D1 may be cache hit data.

In the case of the page buffer, a physical overwrite operation for the cache hit data may be performed. Therefore, the first data D1 stored in the storage space corresponding to page buffer index 1 may be replaced with new data D1'. Likewise, the map information of the first data D1 that is cache hit data may be changed to the map information of the new data D1'.

Since the page buffer may perform a physical overwrite operation, the storage space thereof may be more efficiently used compared to that of the write buffer of FIG. 13A.

Figure 15:
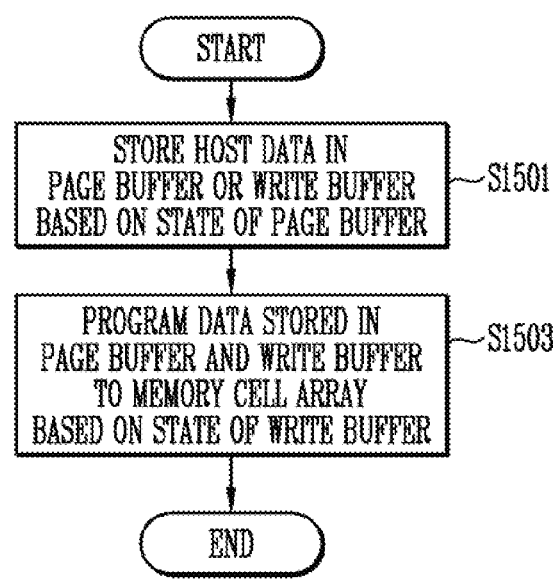
FIG. 15 is a flowchart for describing a method of operating the storage device in accordance with an embodiment of the present disclosure.

FIG. 15 is a flowchart for describing a method of operating the storage device in accordance with an embodiment of the present disclosure.

Referring to FIG. 15, at step S1501, the storage device may store host data in the page buffer or the write buffer based on the state of the page buffer.

At step S1503, the storage device may program data stored in the page buffer and the write buffer to the memory cell array based on the state of the write buffer.

Figure 16:
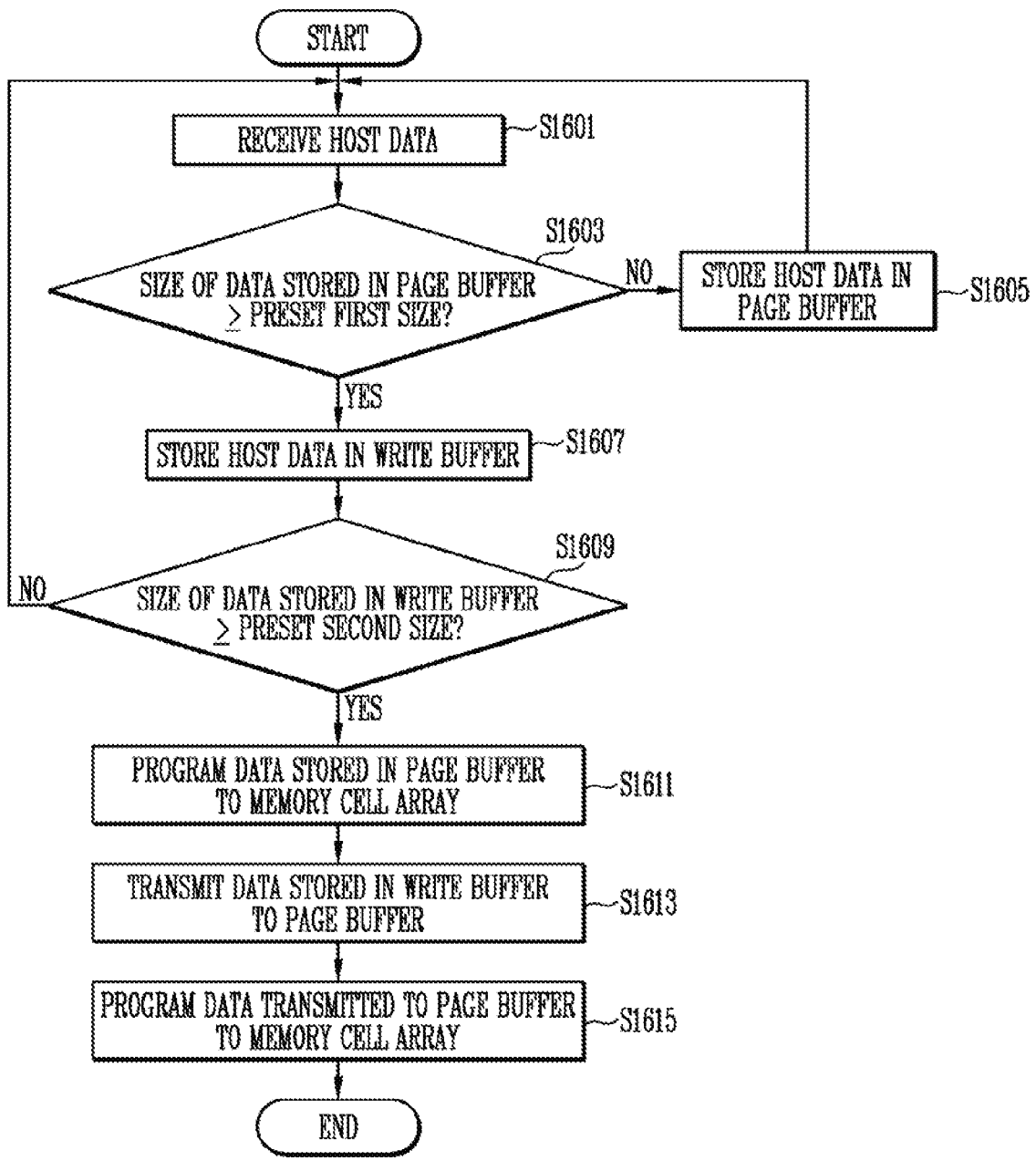
FIG. 16 is a flowchart for describing the method of FIG. 15.

FIG. 16 is a flowchart for describing the method of FIG. 15.

Referring to FIG. 16, at step S1601, the storage device may receive host data from the host. The host data may be data to be stored in the storage device in response to a write request from the host.

At step S1603, the storage device may determine whether or not the size of data stored in the page buffer is equal to or greater than the preset first size. As a result of the determination, if the size of data stored in the page buffer is equal to or greater than the preset first size, the process may proceed to step S1607. If not, the process may proceed to step S1605.

At step S1605, the storage device may store the received host data in the page buffer.

At step S1607, the storage device may store the received host data in the write buffer.

At step S1609, the storage device may determine whether or not the size of data stored in the write buffer is equal to or greater than the preset second size. As a result of the determination, if the size of data stored in the write buffer is equal to or greater than the preset second size, the process may proceed to step S1611. If not, the process may proceed to step S1601.

At step S1611, the storage device may program the data stored in the page buffer to the memory cell array.

At step S1613, the storage device may transmit the data stored in the write buffer to the page buffer.

At step S1615, the storage device may program, to the memory cell array, the data transmitted to the page buffer.

Figure 17:
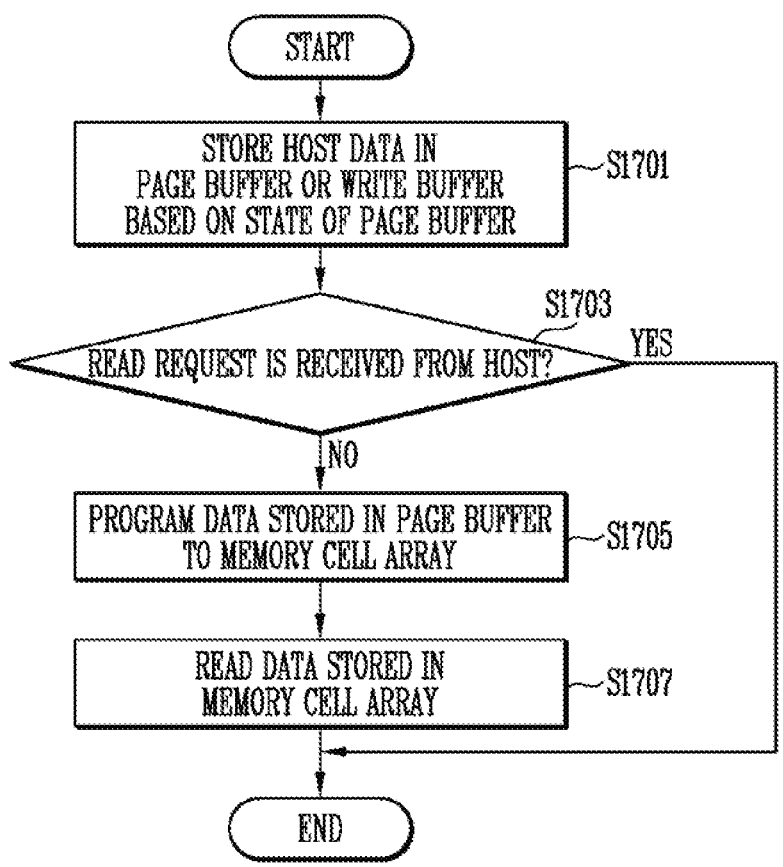
FIG. 17 is a flowchart for describing a method of operating the storage device in accordance with an embodiment of the present disclosure.

FIG. 17 is a flowchart for describing a method of operating the storage device in accordance with an embodiment of the present disclosure.

Referring to FIG. 17, at step S1701, the storage device may store host data in the page buffer or the write buffer based on the state of the page buffer.

At step S1703, the storage device may determine whether a read request has been received from the host. As a result of the determination, if the storage device has received the read request from the host, the process proceeds to step S1705. If not, the process is terminated. Here, the read request may be a read request for data stored in the memory cell array.

At step S1705, the storage device may program the data stored in the page buffer to the memory cell array.

At step S1707, the storage device may read the data stored in the memory cell array, in response to the received read request.

Figure 18:
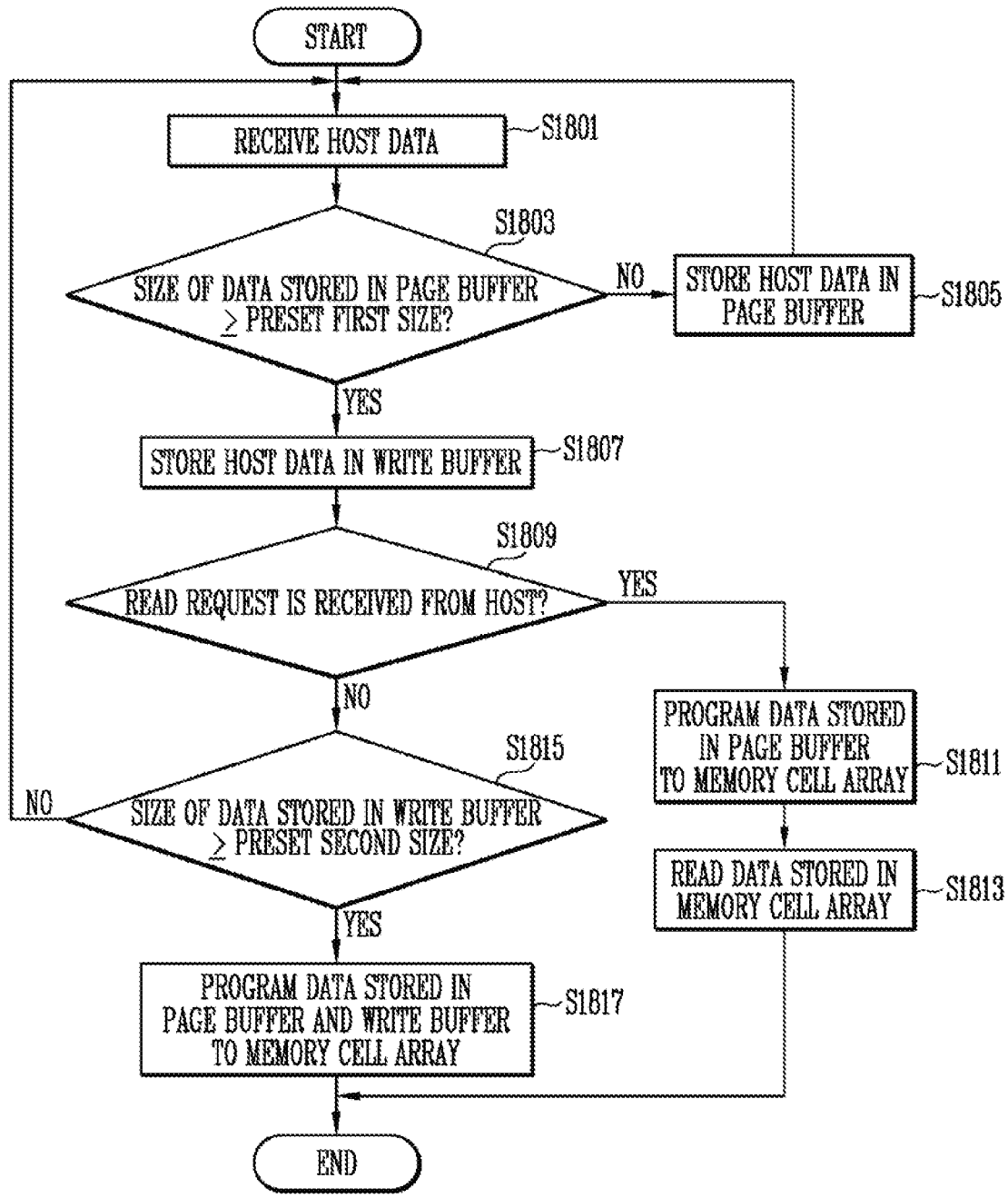
FIG. 18 is a flowchart for describing the method of FIG. 17.

FIG. 18 is a flowchart for describing the method of FIG. 17.

Referring to FIG. 18, at step S1801, the storage device may receive host data from the host. The host data may be data to be stored in the storage device in response to a write request from the host.

At step S1803, the storage device may determine whether or not the size of data stored in the page buffer is equal to or greater than the preset first size. As a result of the determination, if the size of data stored in the page buffer is equal to or greater than the preset first size, the process may proceed to step S1807. If not, the process may proceed to step S1805.

At step S1805, the storage device may store the received host data in the page buffer.

At step S1807, the storage device may store the received host data in the write buffer.

At step S1809, the storage device may determine whether a read request has been received from the host. As a result of the determination, if the storage device has received the read request from the host, the process proceeds to step S1811. If not, the process proceeds to step S1815. Here, the read request may be a read request for data stored in the memory cell array.

At step S1811, the storage device may program the data stored in the page buffer to the memory cell array.

At step S1813, the storage device may read the data stored in the memory cell array, in response to the received read request.

At step S1815, the storage device may determine whether or not the size of data stored in the write buffer is equal to or greater than the preset second size. As a result of the determination, if the size of data stored in the write buffer is equal to or greater than the preset second size, the process may proceed to step S1817. If not, the process may proceed to step S1801.

At step S1817, the storage device may program the data stored in the page buffer and the write buffer to the memory cell array.

Figure 19:
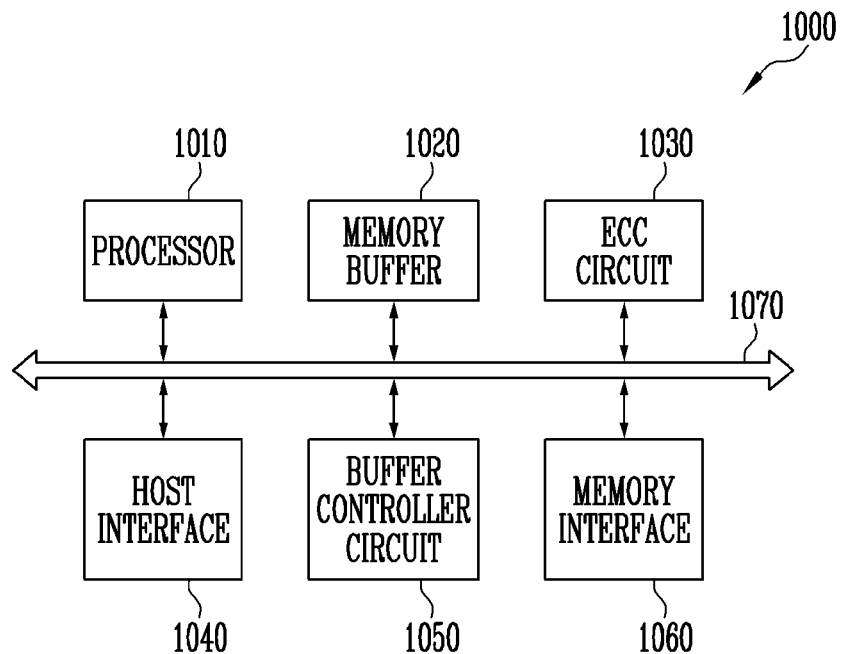
FIG. 19 is a diagram illustrating an example of the memory controller of FIG. 1.

FIG. 19 is a diagram illustrating an example of the memory controller of FIG. 1.

Referring to FIG. 19, a memory controller 1000 is coupled to a host and a memory device. In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

The memory controller 1000 may include a processor 1010, a memory buffer 1020, an error correction code (ECC) circuit 1030, a host Interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device by using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device 100. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device through the channel.

For example, the memory controller 1000 may include neither the memory buffer 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 20:
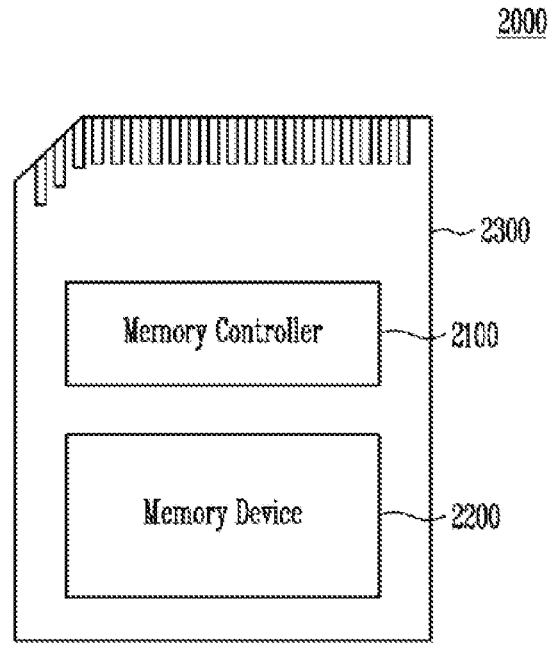
FIG. 20 is a block diagram illustrating a memory card system to which the storage device in accordance with an embodiment of the present disclosure is applied.

FIG. 20 is a block diagram illustrating a memory card system 2000 to which the storage devices in accordance with an embodiment of the present disclosure is applied.

Referring FIG. 20, the memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2200 and the host. The memory controller 2100 may drive firmware for controlling the memory device 2200. The memory controller 2100 may be embodied in the same manner as that of the memory controller 200 described with reference to FIG. 1.

In an embodiment, the memory controller 2100 may include components such as a random access memory (RAM), a processing unit, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 21:
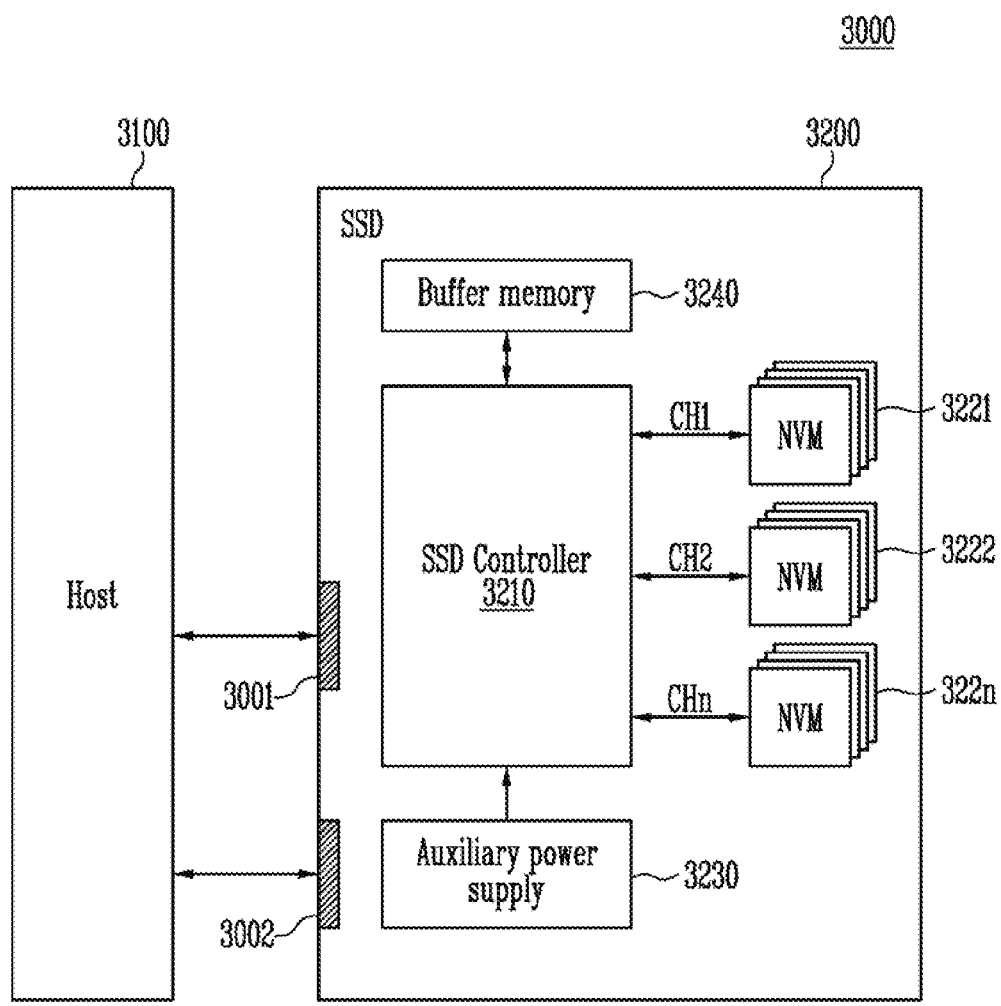
FIG. 21 is a block diagram illustrating a solid state drive (SSD) system to which the storage device in accordance with an embodiment of the present disclosure is applied.

FIG. 21 is a block diagram illustrating a solid state drive (SSD) system 3000 to which the storage devices in accordance with an embodiment of the present disclosure is applied.

Referring to FIG. 21, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322_n_, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322_n_ in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as an FRAM, a ReRAM, an STT-MRAM, and a PRAM.

Figure 22:
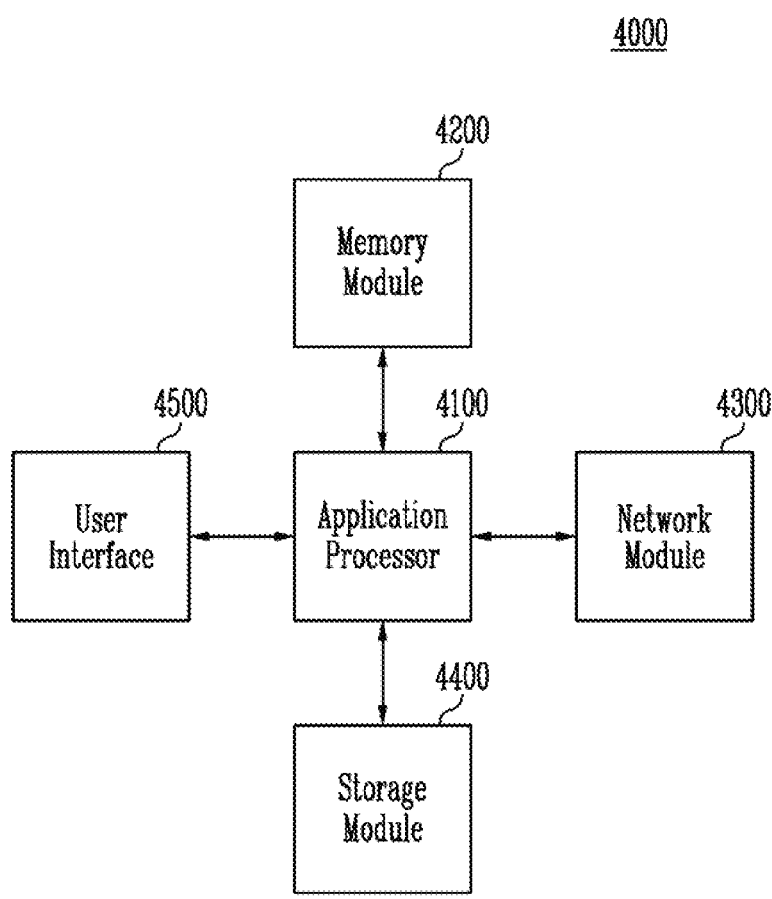
FIG. 22 is a block diagram illustrating a user system to which the storage device in accordance with an embodiment of the present disclosure is applied.

FIG. 22 is a block diagram illustrating a user system 4000 to which the storage devices in accordance with an embodiment of the present disclosure is applied.

Referring to FIG. 22, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device 100 described above with reference to FIG. 1. The storage module 4400 may be operated in the same manner as that of the storage devices 50 described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as an a liquid crystal display (LCD), an organic light emitting diode (OLED) display device, an active matrix OLED (AMOLED) display device, an LED, a speaker, and a motor.

As described above, various embodiments of the present disclosure may provide a storage device having improved write performance, and a method of operating the storage devices.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A storage device comprising:
   a memory device comprising a memory cell array and a page buffer; and
   a memory controller comprising a write buffer,
   wherein the memory device further comprises a page buffer state determiner configured to generate a page buffer state signal based on a result of determining a state of the page buffer and provide the page buffer state signal to the memory controller, and
   wherein the memory controller further comprises a write operation controller configured to provide data provided from a host to any one of the page buffer and the write buffer in response to the page buffer state signal, and control the memory device to program data stored in the page buffer to the memory cell array based on a state of the write buffer, and
   wherein the write operation controller is configured to transmit data stored in the write buffer to the page buffer after programming the data stored in the page buffer to the memory cell array.

2. The storage device according to claim 1, wherein the memory device is configured to program the transmitted data stored in the write buffer to the memory cell array.

3. The storage device according to claim 1, wherein the page buffer state determiner generates the page buffer state signal that is enabled or disabled depending on a result of comparing a size of the data stored in the page buffer with a first size.

4. The storage device according to claim 3, wherein, when the size of the data stored in the page buffer is equal to or greater than the first size, the page buffer state determiner generates the page buffer state signal that is enabled.

5. The storage device according to claim 3, wherein, when the size of the data stored in the page buffer is less than the first size, the page buffer state determiner generates the page buffer state signal that is disabled.

6. The storage device according to claim 3, wherein the first size is a size of data capable of being stored in a single physical page of the memory cell array.

7. The storage device according to claim 1, wherein the write operation controller comprises:

a mode setting circuit configured to set a write operation mode based on the page buffer state signal and generate write operation mode information indicating whether the write operation mode is a normal mode or a bypass mode;

a data path selector configured to provide the data provided from the host to any one of the page buffer and the write buffer based on the write operation mode information;

a write buffer state determiner configured to generate a write buffer state signal that is enabled or disabled depending on a result of comparing a size of the data stored in the write buffer with a second size; and a command controller configured to provide a first command or a second command to the memory device based on the write operation mode information and the write buffer state signal.

8. The storage device according to claim 7, wherein, when the page buffer state signal is enabled, the mode setting circuit sets the write operation mode to the normal mode.

9. The storage device according to claim 7, wherein, when the page buffer state signal is disabled, the mode setting circuit sets the write operation mode to the bypass mode.

10. The storage device according to claim 7, wherein, when the write operation mode is the normal mode, the data path selector provides the data provided from the host to the write buffer.

11. The storage device according to claim 7, wherein, when the write operation mode is the bypass mode, the data path selector provides the data provided from the host to the page buffer.

12. The storage device according to claim 11, wherein, when the write operation mode is the bypass mode, the command controller provides, to the memory device, the second command for instructing to store the data provided from the host in the page buffer.

13. The storage device according to claim 7, wherein, when the size of the data stored in the write buffer is equal to or greater than the second size, the page buffer state determiner generates the write buffer state signal that is enabled.

14. The storage device according to claim 13, wherein, when the write operation mode is the normal mode, the command controller provides, to the memory device, the first command for instructing to program the data stored in the page buffer to the memory cell array, in response to the write buffer state signal that is enabled.

15. The storage device according to claim 14, wherein, after having provided the first command to the memory device, the command controller provides, to the memory device, the second command for instructing to store, in the page buffer, the data stored in the write buffer, and provides the first command to the memory device again.

16. The storage device according to claim 1, wherein, when new data is stored in a logical address of the existing data stored in the page buffer, the write operation controller overwrites the existing data with the new data and changes map information of the existing data to map information of the new data.

17. The storage device according to claim 1, wherein, when new data is stored in a logical address of the existing data stored in the write buffer, the write operation controller invalidates map information of the existing data, stores the new data in the write buffer, and validates map information of the new data.

18. The storage device according to claim 1, wherein, when a read request for data stored in the memory cell array is received from the host, the write operation controller provides, to the memory device, a first command for programming the data stored in the page buffer to the memory cell array, and controls the memory device to perform an operation corresponding to the read request.

19. A method of operating a storage device comprising a memory device including a page buffer, and a memory controller including a write buffer, the method comprising:

storing data provided from a host in any one of the page buffer and the write buffer based on a state of the page buffer; and programming data stored in the page buffer and the write buffer to a memory cell array of the memory device based on a state of the write buffer, wherein the storing comprises storing the data in any one of the page buffer and the write buffer based on a result of comparing a size of data stored in the page buffer with a first size, and wherein the first size is a size of data capable of being stored in a single physical page.

20. The method according to claim 19, wherein the programming comprises programming data stored in the page buffer and data stored in the write buffer to the memory cell array when a size of the data stored in the write buffer is equal to or greater than a preset second size.

21. The method according to claim 19, wherein the state of the page buffer is determined based on an amount of data stored in the page buffer, and wherein the state of the write buffer is determined based on an amount of data stored in the write buffer.

22. A storage device comprising:

a memory device comprising a memory cell array and a page buffer; and a memory controller comprising a write buffer, wherein the memory device is configured to determine an amount of data stored in the page buffer, wherein the memory controller is configured to provide data to any one of the page buffer and the write buffer based on the amount of data stored in the page buffer, and control the memory device to program the data stored in the page buffer to the memory cell array based on an amount of data stored in the write buffer, and wherein the memory controller is configured to transmit data stored in the write buffer to the page buffer after programming the data stored in the page buffer to the memory cell array.

23. The storage device according to claim 22, wherein the memory controller provides the data provided from a host to any one of the page buffer and the write buffer.

24. The storage device according to claim 23, wherein when the amount of data stored in the page buffer is greater than or equal to a first preset amount of data then the data provided from the host is stored in the write buffer.

25. The storage device according to claim 24, wherein when the amount of data stored in the write buffer is greater than or equal to a second preset amount of data then the data stored in the page buffer is programmed to the memory cell array after the amount of data stored in the page buffer is greater than or equal to the first preset amount of data.

26. The storage device according to claim 23, wherein a first preset amount of data is an amount of data capable of being stored in a single physical page of the memory cell array.

* * * * *